(12) United States Patent
Burke et al.

(10) Patent No.: US 7,897,462 B2
(45) Date of Patent: Mar. 1, 2011

(54) METHOD OF MANUFACTURING SEMICONDUCTOR COMPONENT WITH GATE AND SHIELD ELECTRODES IN TRENCHES

(75) Inventors: Peter A. Burke, Portland, OR (US); Duane B. Barber, Portland, OR (US); Brian Pratt, Gresham, OR (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 131 days.

(21) Appl. No.: 12/271,083

(22) Filed: Nov. 14, 2008

(65) Prior Publication Data
US 2010/0123192 A1      May 20, 2010

(51) Int. Cl.
*H01L 21/336* (2006.01)
(52) U.S. Cl. .............. 438/270; 438/589; 438/702; 257/E21.419
(58) Field of Classification Search .............. 438/270, 438/283, 294, 589, 696, 702; 257/E21.177, 257/E21.41, E21.419, E21.46
See application file for complete search history.

(56) References Cited

U.S. PATENT DOCUMENTS

| | | | |
|---|---|---|---|
| 4,455,565 A | 6/1984 | Goodman et al. | |
| 4,941,026 A | 7/1990 | Temple | |
| 5,763,915 A | 6/1998 | Hshieh et al. | |
| 5,877,528 A | 3/1999 | So | |
| 5,912,490 A | 6/1999 | Herbert et al. | |
| 5,998,833 A | 12/1999 | Baliga | |
| 6,388,286 B1 | 5/2002 | Baliga | |
| 6,621,121 B2 | 9/2003 | Baliga | |
| 6,764,889 B2 | 7/2004 | Baliga | |
| 6,787,464 B1* | 9/2004 | Cheek et al. | 438/683 |
| 6,787,848 B2 | 9/2004 | Ono et al. | |
| 7,005,347 B1 | 2/2006 | Bhalla et al. | |
| 7,183,610 B2 | 2/2007 | Pattanayak et al. | |
| 2006/0273386 A1 | 12/2006 | Yilmaz et al. | |
| 2007/0059887 A1* | 3/2007 | Poelzl et al. | 438/270 |
| 2007/0063272 A1 | 3/2007 | Arena et al. | |
| 2008/0197407 A1 | 8/2008 | Challa et al. | |
| 2008/0199995 A1 | 8/2008 | Woolsey et al. | |
| 2009/0179310 A1 | 7/2009 | Dunton et al. | |

OTHER PUBLICATIONS

Ishikawa and Esaki, A High-Power High-Gain VD-MOSFET Operating at 900 MHz, IEEE Transactios on Electron Devices, vol. ED-34, No. 5, pp. 1157-1162, May 1987.

* cited by examiner

*Primary Examiner*—Benjamin P Sandvik
*Assistant Examiner*—W. Wendy Kuo
(74) *Attorney, Agent, or Firm*—Rennie William Dover

(57) ABSTRACT

A semiconductor component that includes gate electrodes and shield electrodes and a method of manufacturing the semiconductor component. A semiconductor material has a device region, a gate contact region, a termination region, and a drain contact region. One or more device trenches is formed in the device region and one or more termination trenches is formed in the edge termination region. Shielding electrodes are formed in portions of the device trenches that are adjacent their floors. A gate dielectric material is formed on the sidewalls of the trenches in the device region and gate electrodes are formed over and electrically isolated from the shielding electrodes. The gate electrodes in the trenches in the device region are connected to the gate electrodes in the trenches in the gate contact region. The shielding electrodes in the trenches in the device region are connected to the shielding electrodes in the termination region.

15 Claims, 25 Drawing Sheets

US 7,897,462 B2

METHOD OF MANUFACTURING SEMICONDUCTOR COMPONENT WITH GATE AND SHIELD ELECTRODES IN TRENCHES

TECHNICAL FIELD

The present invention relates, in general, to electronics and, more particularly, to semiconductor components and their manufacture.

BACKGROUND

Metal-Oxide Semiconductor Field Effect Transistors ("MOSFETS") are a common type of power switching device. A MOSFET device includes a source region, a drain region, a channel region extending between the source and drain regions, and a gate structure provided adjacent to the channel region. The gate structure includes a conductive gate electrode layer disposed adjacent to and separated from the channel region by a thin dielectric layer. When a voltage of sufficient strength is applied to the gate structure to place the MOSFET device in an on state, a conduction channel region forms between the source and drain regions thereby allowing current to flow through the device. When the voltage that is applied to the gate is not sufficient to cause channel formation, current does not flow and the MOSFET device is in an off state.

In the past, the semiconductor industry used various different device structures and methods to form MOSFETS. One particular structure for a vertical power MOSFET used trenches that were formed in an active area of the MOSFET. A portion of those trenches were used as the gate regions of the transistor. Some of these transistors also had a shield conductor that assisted in lowering the gate-to-drain capacitance of the transistor. Another portion of the transistor that was external to the active area was often referred to as a termination area of the transistor. Generally, two different conductors were formed in the termination region in order to make electrical contact to the gate and shield electrodes of the transistor. These two conductors generally were formed overlying each other as a two conductor stack on the surface of the substrate within the termination area. However, such structures generally had a high stack height which made them difficult to reliably manufacture and a high manufacturing cost.

Accordingly, it would be advantageous to have a semiconductor component and a method for forming the semiconductor component that results in better process control and lower costs, and that results in a lower resistance for the gate and shield conductors. It would be of further advantage for the semiconductor component to be cost efficient to manufacture.

BRIEF DESCRIPTION OF THE DRAWINGS

The present invention will be better understood from a reading of the following detailed description, taken in conjunction with the accompanying drawing figures, in which like reference characters designate like elements and in which.

Figure 1:
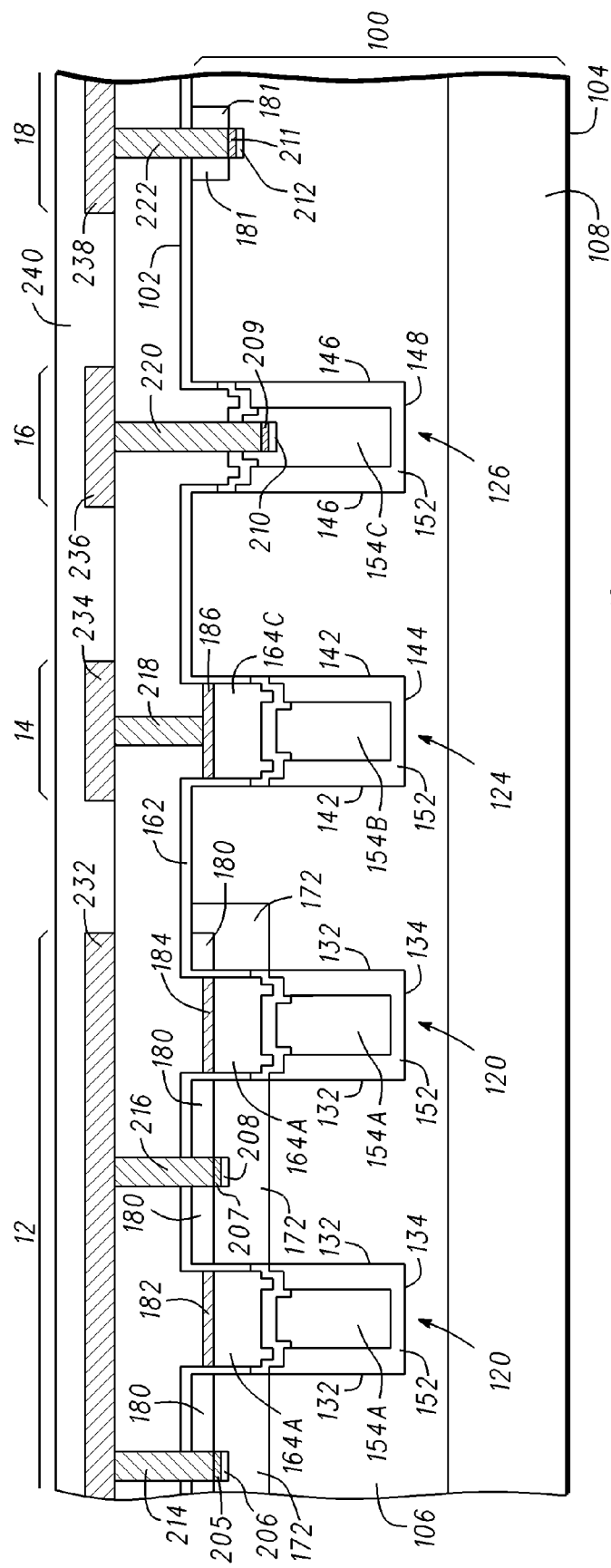
FIG. 1 is a cross-sectional view of a semiconductor component during manufacture in accordance with an embodiment of the present invention.

For simplicity and clarity of the illustration, elements in the figures are not necessarily drawn to scale, and the same reference characters in different figures denote the same elements. Additionally, descriptions and details of well-known steps and elements are omitted for simplicity of the description. As used herein current carrying electrode means an element of a device that carries current through the device such as a source or a drain of a MOSFET, or an emitter or a collector of a bipolar transistor, or a cathode or an anode of a diode, and a control electrode means an element of the device that controls current through the device such as a gate of a MOSFET or a base of a bipolar transistor. Although the devices are explained herein as certain N-channel or P-channel devices, or certain N-type or P-type doped regions, a person of ordinary skill in the art will appreciate that complementary devices are also possible in accordance with embodiments of the present invention. The use of the words approximately or about means that a value of an element has a parameter that is expected to be very close to a stated value or position or state. However, it is well known in the art that there are always minor variances that prevent the values or positions from being exactly as stated. It is well established in the art that variances of up to about ten percent (10%) (and up to twenty percent (20%) for semiconductor doping concentrations) are regarded as reasonable variance from the ideal goal as described. For clarity of the drawings, doped regions of semiconductor component structures are illustrated as having generally straight line edges and precise angular corners. However, those skilled in the art understand that due to the diffusion and activation of dopants the edges of doped regions generally may not be straight lines and the corners may not be precise angles.

In addition, the description may illustrate a cellular design (where the body regions are a plurality of cellular regions) or a single body design (where the body region is comprised of a single region formed in an elongated pattern, typically in a serpentine pattern or formed in a plurality of stripes). However, it is intended that the description is applicable to both a cellular implementation and a single base implementation.

In some instances, well-known methods, procedures, components, and circuits have not been described in detail so as not to obscure the present disclosure. The following detailed description is merely exemplary in nature and is not intended to limit the disclosure of this document and uses of the disclosed embodiments. Furthermore, there is no intention to be bound by any expressed or implied theory presented in the preceding text, including the title, technical field, background, or abstract.

DETAILED DESCRIPTION

Generally, the present invention provides a semiconductor component having one or more trenches in which a shield electrode and a gate electrode are formed. In accordance with an aspect of the present invention, trenches 120 are lined with an oxide layer 152 and polysilicon electrodes 154A are formed over the oxide layer 152. A portion of oxide layer 152 is removed to expose portions of the sidewalls of trenches 120 and top surfaces 155 of polysilicon electrodes 154A. A dielectric material 160 is formed over the top surfaces of polysilicon electrodes 154A. A gate dielectric material 162 such as, for example, a gate oxide may be formed on the sidewalls and over dielectric material 160. Gate electrodes 164A are formed over the gate dielectric material 162. Gate oxide thinning results from the gate oxide being grown on different silicon planes along the trench sidewall. The growth rate of the gate oxide at the interface with dielectric layer 152 is slower than the growth of oxide on the exposed trench sidewalls. As the gate oxide grows, a kink or bend is created by the difference in oxide growth rates that exposes different silicon planes which have slower oxide growth rates. Thus, dielectric layer 160 serves as a thin layer that has a stub 163 that compensates for gate oxide thinning that may occur at the kink in the trench sidewalls and to spread out the depth of the trench where tapering of the trench occurs. Stub 163 helps with isolation and to mitigate leakage in the semiconductor components.

In accordance with another aspect of the present invention, the kink is moved into trenches 120 so that they are formed in a portion of sidewalls 132 of trenches 120 that are away from high field regions.

In accordance with another aspect of the present invention, polysilicon from a second layer of polysilicon is removed from above semiconductor material 100.

Figure 2:
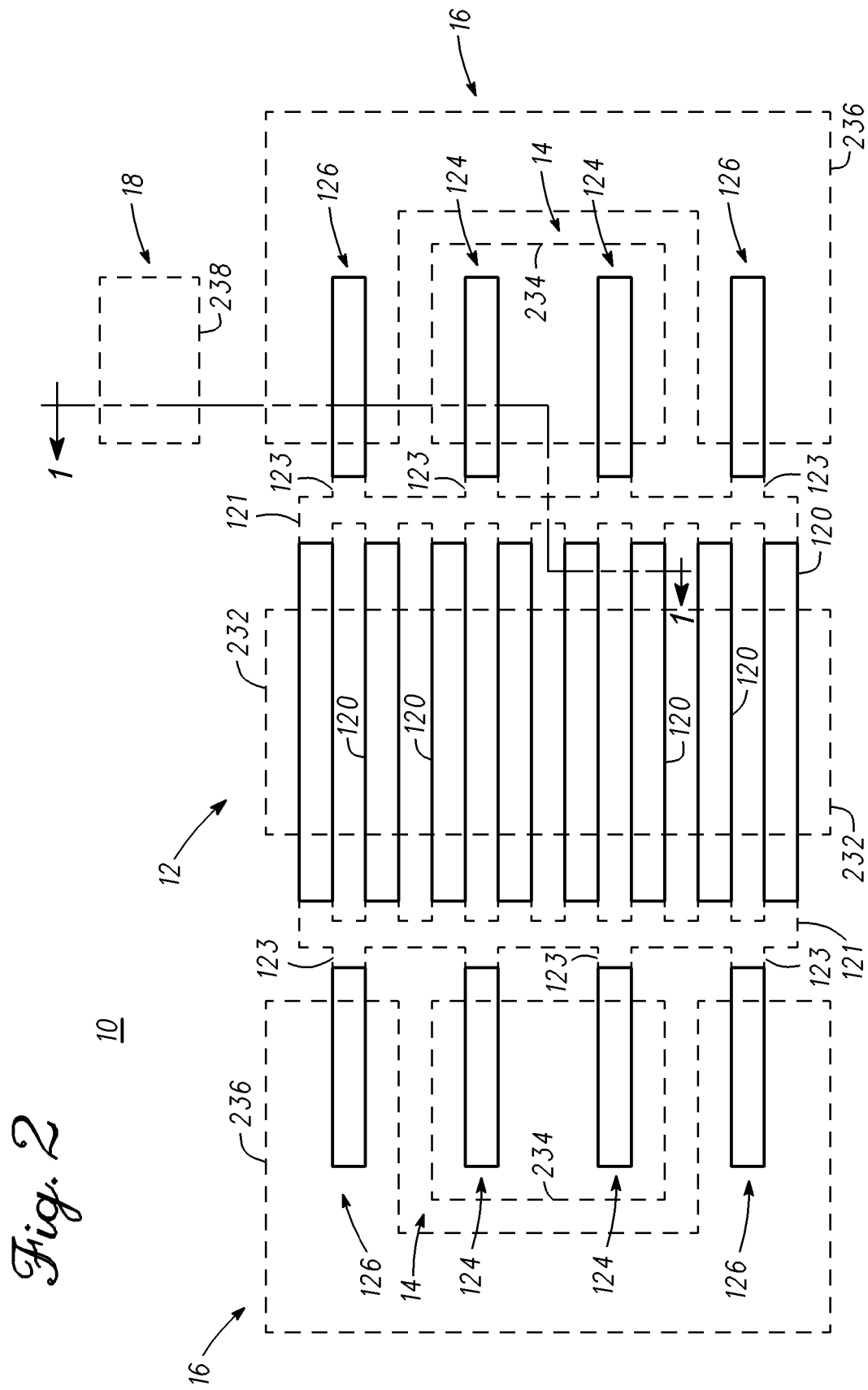
FIG. 2 is a plan view of the semiconductor component of FIG. 1.

FIG. 1 is a cross-sectional side view of a semiconductor component 10 in accordance with an embodiment of the present invention, where the cross-sectional view is taken along section line 1-1 of FIG. 2. The manufacture of semiconductor component 10 is further described with reference to FIGS. 2-22. By way of example, semiconductor component 10 is an N-channel field effect transistor that has an active region 12, a gate contact region 14, a termination region 16, and a drain contact region 18. Active region 12 includes source regions 180, gate electrodes 164A, drain regions, and doped regions 172. The portions of epitaxial layer 106 adjacent to doped region 172 serve as the drain regions and the channel regions are formed from doped regions 172 and 180 and gate electrodes 164A.

Gate contact region 14 facilitates electrically coupling the gate electrodes 164A that are in active region 12 to an input/output conductor (not shown). Termination region 16 facilitates electrically coupling shield conductors 154A that are in active region 12, shield conductor 154B that is in gate contact region 14, and shield conductor 154C to a common termination conductor 236. Drain contact region 18 facilitates contacting the drain regions that are in active region 12 to a drain contact 238.

FIG. 2 illustrates an enlarged plan view of semiconductor component 10 shown in FIG. 1. In accordance with an embodiment of the present invention, semiconductor component 10 is an N-channel field effect transistor having a source conductor 232, a gate conductor 234, a shield conductor 236, and a drain conductor 238. Source conductor 232, gate conductor 234, shield conductor 236, and drain conductor 238 are illustrated by dashed or broken lines. Cross-section line 1-1 illustrates the cross-section used for the view illustrated in FIG. 1 and the regions at which cross sections are taken for the views illustrated in FIGS. 3-36. Trenches 120 are illustrated in active region 12, trenches 124 are illustrated in gate contact region 14, and trenches 126 are illustrated in termination region 16. Reference characters 121 and 123 are further described below.

Figure 3:
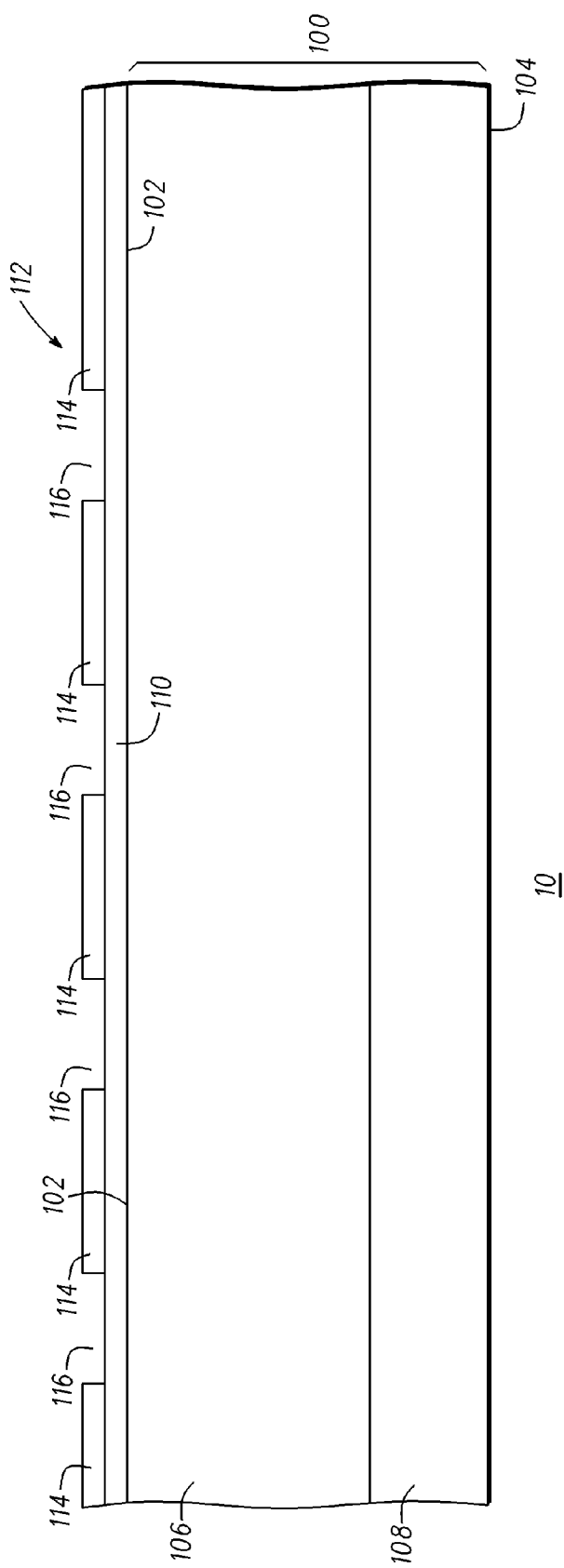
FIG. 3 is a cross-sectional view of the semiconductor component of FIG. 2 at an early stage of manufacture.

FIG. 3 is a cross-sectional view of portions of semiconductor component 10 during manufacture in accordance with an embodiment of the present invention. What is shown in FIG. 3 is a semiconductor material 100 having opposing surfaces 102 and 104. Surface 102 is also referred to as a front or top surface and is located at a top side of semiconductor material 100 and surface 104 is also referred to as a bottom or back surface and is located at a bottom side of semiconductor material 100. In accordance with an embodiment of the present invention, semiconductor material 100 comprises an epitaxial layer 106 disposed on a semiconductor substrate 108. Preferably, substrate 108 is silicon that is heavily doped with an N-type dopant or impurity material and epitaxial layer 106 is silicon that is lightly doped with an N-type dopant. In an example of a semiconductor device having a 30 volt breakdown voltage, the resistivity of substrate layer 108 may be less than about 0.01 Ohm-centimeters ("$\Omega$-cm") and preferably less than about 0.005 $\Omega$-cm, and the resistivity of epitaxial layer 106 may be greater than about 0.1 $\Omega$-cm and preferably greater than about 0.2 $\Omega$-cm. Substrate layer 108 provides a low resistance conduction path for the current that flows through a power transistor and a low resistance electrical connection to a top drain conductor that may be formed on top surface 102 of substrate 100, a bottom drain conductor that may be formed on bottom surface 104, or both. It should be noted that semiconductor material 100 is not limited to being an epitaxial layer formed on a semiconductor substrate. For example, semiconductor material 100 may be a semiconductor substrate such as silicon. A region or layer doped with an N-type dopant is referred to as having an N-type conductivity or an N conductivity type and a region or layer doped with a P-type dopant is referred to as having a P-type conductivity or a P conductivity type.

A layer of dielectric material 110 having a thickness ranging from about 1,000 Angstroms (Å) to about 5,000 Å is formed on or from epitaxial layer 106. In accordance with an embodiment of the present invention dielectric layer 110 is a low temperature oxide ("LTO") having a thickness of about 3,000 Å. The type of dielectric material is not a limitation of the present invention. A layer of photoresist is patterned over oxide layer 110 to form a masking structure 112 having masking elements 114 and openings 116 that expose portions of oxide layer 110. Masking structure 112 is also referred to as a mask or an etch mask.

Figure 4:
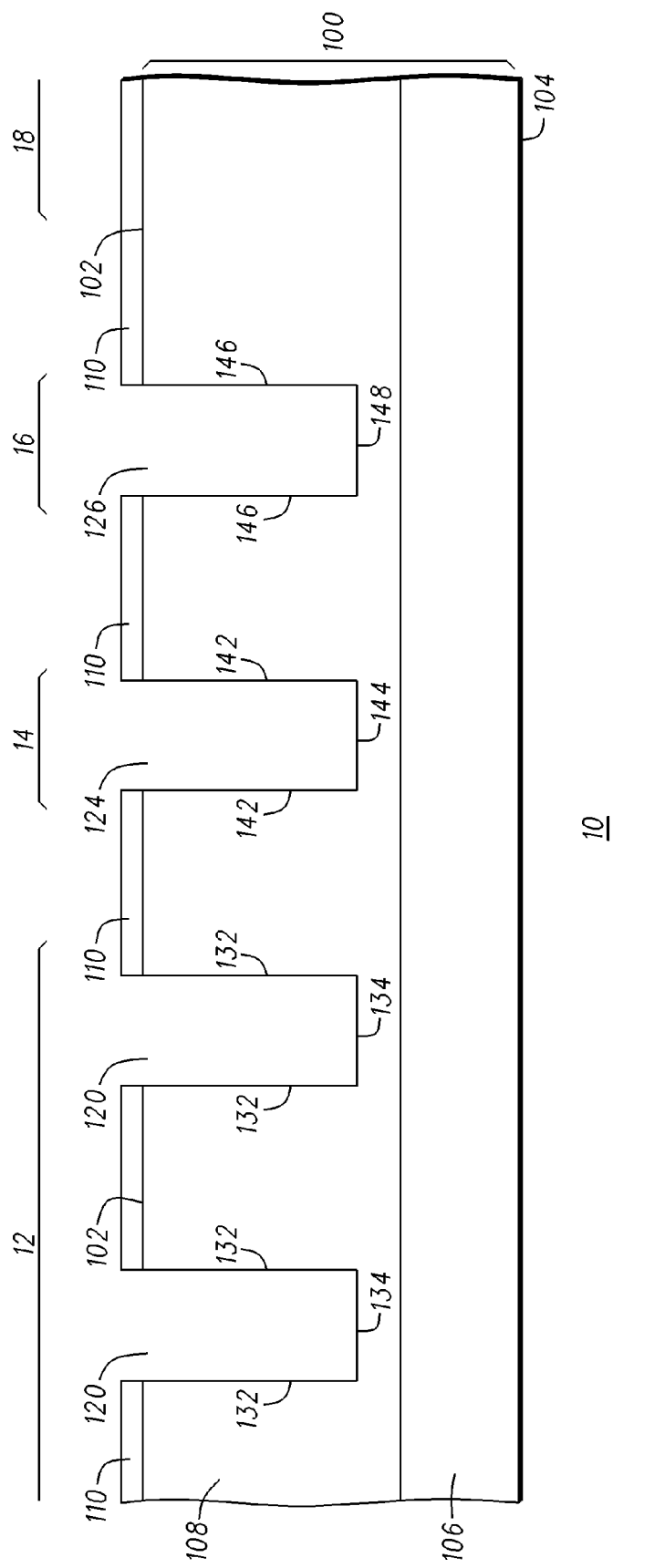
FIG. 4 is a cross-sectional view of the semiconductor component of FIG. 3 at a later stage of manufacture.

Referring now to FIG. 4, the exposed portions of oxide layer 110 and the portions of epitaxial layer 106 below the exposed portions of oxide layer 110 are removed to form trenches 120, 124, and 126 that extend from surface 102 into epitaxial layer 106. Trenches 120 are formed in active region 12, trench 124 is formed in gate region 14, and trench 126 is formed in termination or edge termination region 16. Trenches 120 are referred to as device trenches, trench 124 is referred to as a gate contact trench, and trench 126 is referred to as a termination trench. Preferably, adjacent trenches 120 in device region 12 are equidistant from each other. Trenches 120 have sidewalls 132 and a floor 134, trench 124 has sidewalls 142 and a floor 144, and trench 126 has sidewalls 146 and a floor 148. Preferably, trenches 120, 124, and 126 are formed using an anisotropic etch such as, for example, an anisotropic reactive ion etch ("RIE"). Sidewalls 132, 142, and 146 may serve as vertical surfaces and floors 134, 144, and 148 may serve as horizontal surfaces. For the sake of clarity sidewalls 132, 142, and 146 have been shown as being substantially perpendicular to floors 134, 144, and 148. However, it should be understood that in practice floors 134, 144, and 148, i.e., the bottoms of the trenches, are preferably rounded and sidewalls 132, 142, and 146 may be slightly tapered. Although trenches 120, 124, and 126 are shown as ending in epitaxial layer 106, this is not a limitation of the present invention. For example, trenches 120, 124, and 126 may end at substrate 108 or they may extend into substrate 108. The etching technique and the number of trenches formed in epitaxial layer 106 are not limitations of the present invention.

Referring to FIGS. 2 and 4, trenches 120 preferably are formed as a plurality of stripes extending substantially parallel to each other across the surface of substrate 100. Plurality of trenches 124 and 126 are formed at each end of trenches 120. Forming electrical contact to conductors 154A and 154B and conductors 164A, 164B, and 164C at both ends of the stripes reduces the resistance of shield conductors 154A and 154B and gate conductors 164A-164C, thereby improving the switching speed of semiconductor component 10.

When openings 116 (shown in FIG. 3) are formed in masking structure 112 for the formation of trenches 120, 124, and 126, the openings for trenches 120 are extended to form a portion that is perpendicular to the long axis of each of trenches 120 as illustrated by a dashed line 121. This extended portion of trenches 120 and 124 has a structure that is similar to trench 120. As shield conductors 154A are formed in trenches 120, they are also formed in the portion of the opening illustrated by dashed or broken line 121. As a result, shield conductors 154A within trenches 120 also extend perpendicular to trenches 120 within the opening illustrated by broken line 121 as a shield inter-conductor. This shield inter-conductor interconnects all shield conductors 154A together thereby reducing the resistance of the shield conductors. The shield inter-conductor also connects conductors 154A to conductor 154B. Similarly, as gate conductors 164A and dielectric materials are formed in trenches 120, the dielectric material and gate conductors 164A also extend perpendicular to trenches 120 within the opening illustrated by broken line 121. This extension of gate conductors 164A forms a gate inter-conductor that interconnects all gate conductors 164A together thereby reducing the resistivity of the gate conductors. Thus, the gate inter-conductor and the shield inter-conductor within the opening illustrated by broken line 121 also intersect with and are electrically connected to respective gate conductor 164C and shield conductor 154B that are within trenches 124. Furthermore, the opening 116 in masking structure 112 for forming trenches 126 also extends, as illustrated by broken line 123, to intersect the opening illustrated by broken line 121. Consequently, the shield inter-conductor intersects with and is electrically connected to conductor 154C that is in within each of trenches 126.

Figure 5:
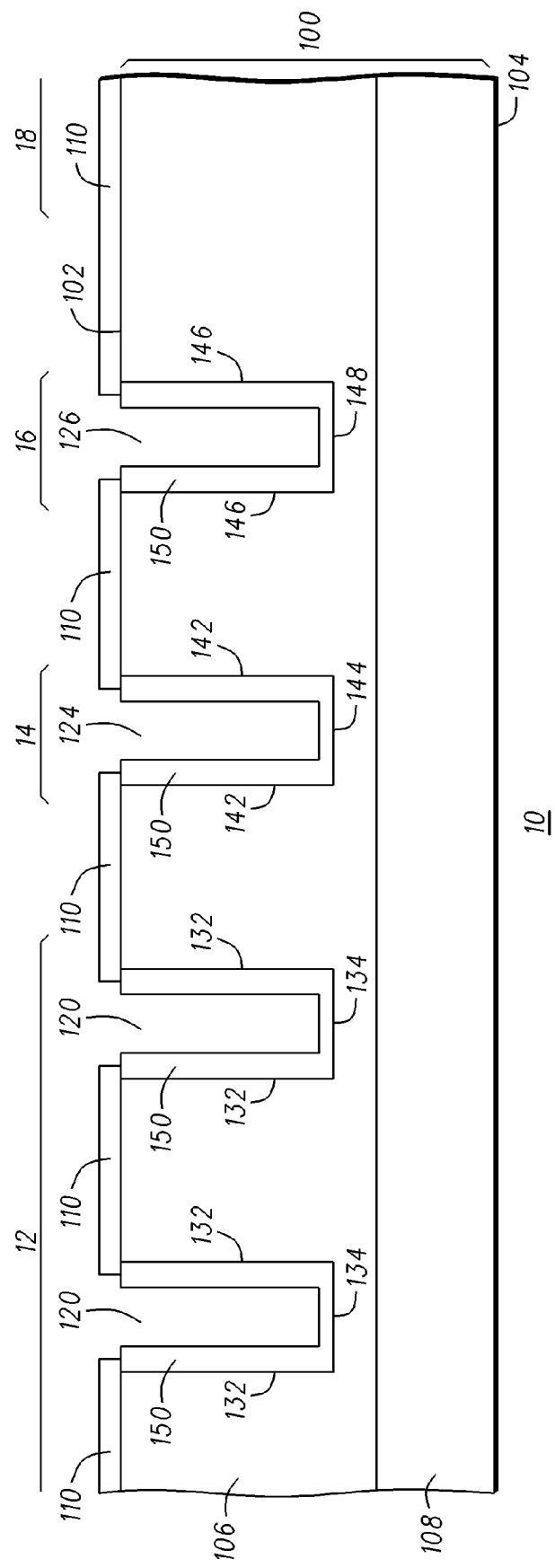
FIG. 5 is a cross-sectional view of the semiconductor component of FIG. 4 at a later stage of manufacture.

Referring now to FIG. 5, a sacrificial dielectric layer 150 having a thickness ranging from about 500 Å to about 2,000 Å is formed from or on sidewalls 132, 142, and 146 and from or on floors 134, 144, and 148. Preferably, dielectric layer 150 is formed by thermal oxidation in a dry ambient and is thicker at the top of trenches 120, 124, and 126 to add a slope to trenches 120, 124, and 126. Dielectric layer 150 rounds the bottom and top corners of trenches 120, 124, and 126, removes any damage from sidewalls 132, 142, and 146 and from floors 134, 144, and 148 resulting from the RIE process, provides a high quality surface for subsequent oxidation steps, and widens trenches 120, 124, and 126. As discussed above, the bottoms of the trenches preferably are rounded and sidewalls 132, 142, and 146 may be slightly tapered.

Figure 6:
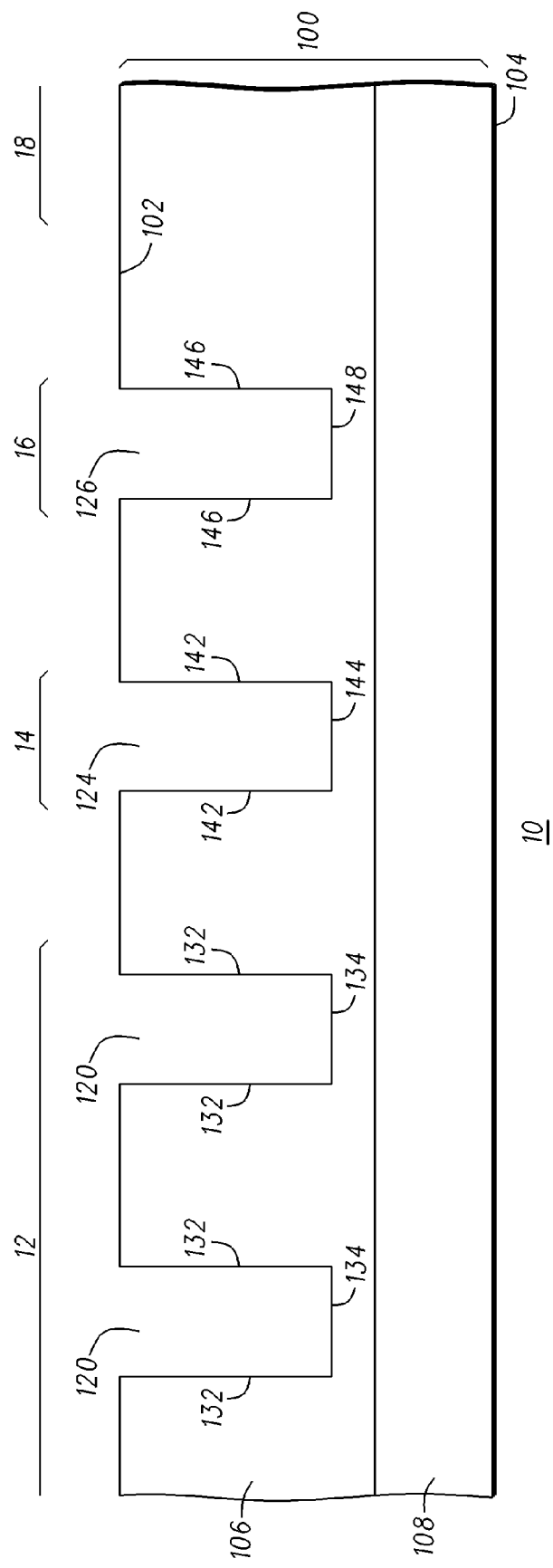
FIG. 6 is a cross-sectional view of the semiconductor component of FIG. 5 at a later stage of manufacture.

Referring now to FIG. 6, sacrificial oxide layer 150 and the remaining portions of oxide layer 110 are stripped from epitaxial layer 106.

Figure 7:
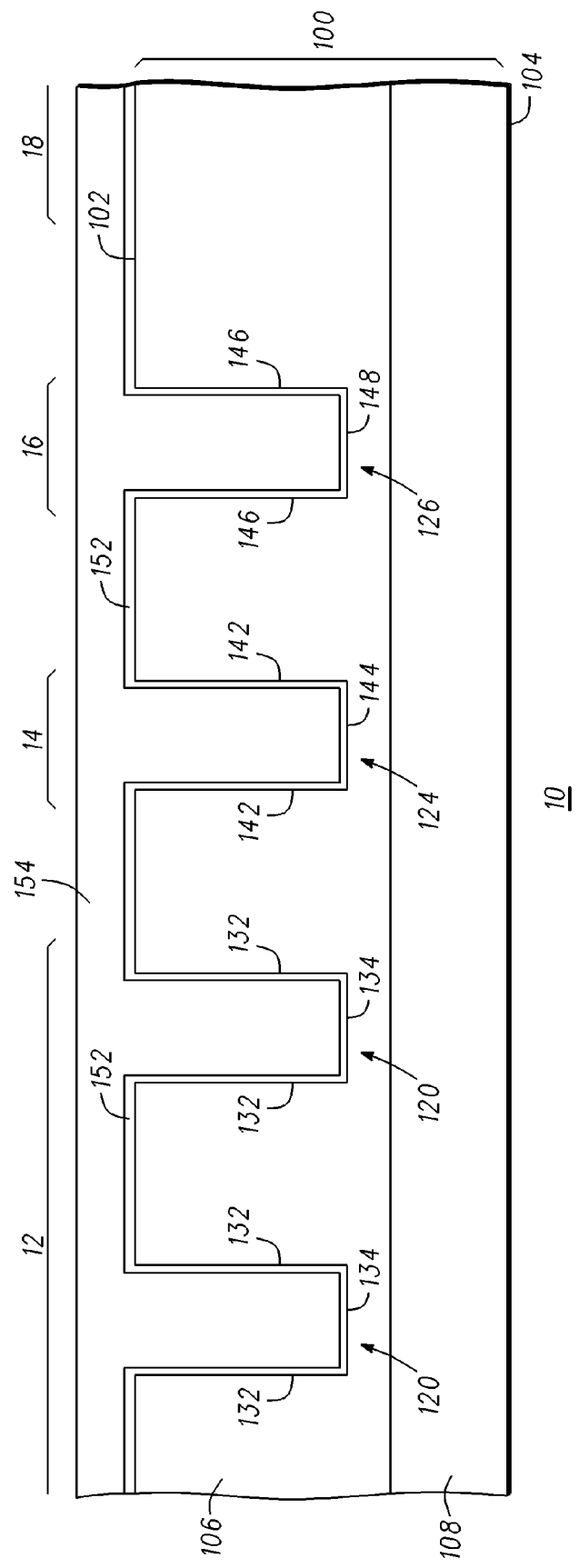
FIG. 7 is a cross-sectional view of the semiconductor component of FIG. 6 at a later stage of manufacture.

Referring now to FIG. 7, a layer of dielectric material 152 having a thickness ranging from about 500 Å to about 2,000 Å is formed on surface 102, sidewalls 132, 142, and 146, and floors 134, 144, and 148. It should be noted that the thickness of dielectric layer 152 may be set in accordance with the desired breakdown voltage. For example, for a 30 volt BVDSS, dielectric layer 152 has a thickness ranging from about 800 Å to about 1,200 Å. By way of example, dielectric layer 152 is oxide that may be formed by oxidation of the exposed portions of epitaxial layer 106, decomposition of tetraethylorthosilicate, or the like. A layer of polysilicon 154 having a thickness ranging from about 3,500 Å to about 6,000 Å is formed on dielectric layer 152 and preferably fills trenches 120, 124, and 126. When the conductivity type of epitaxial layer 106 is N-type, the conductivity type of polysilicon layer 154 is preferably N-type. Polysilicon layer 154 is annealed so that it is substantially free of voids. By way of example, polysilicon layer 154 is a doped with phosphorus, has a thickness of about 4,800 Å, and is annealed at a temperature of about 1,100 Degrees Celsius (° C.) for about 20 minutes.

Figure 8:
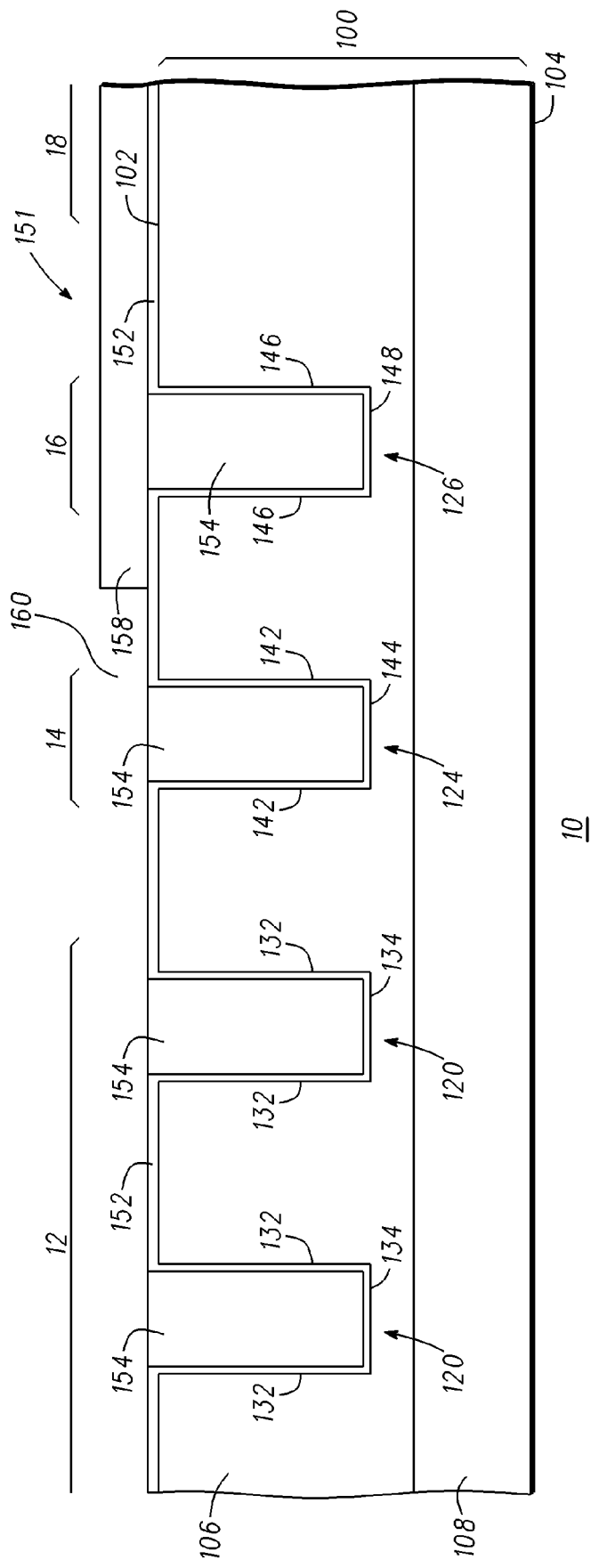
FIG. 8 is a cross-sectional view of the semiconductor component of FIG. 7 at a later stage of manufacture.

Referring now to FIG. 8, polysilicon layer 154 is planarized using, for example, a chemical mechanical planarization ("CMP") process that is selective for the material of dielectric layer 152, i.e., dielectric layer 152 serves as an etch stop for the CMP process. Planarization of polysilicon layer 154 leaves portions of polysilicon layer 154 in trenches 120, 124, and 126. A layer of photoresist is patterned over the portions of polysilicon layer 154 in trenches 120, 124, and 126 and over the exposed portions of dielectric layer 152 to form a masking structure 151 having a masking element 158 that protects the portions of polysilicon layer 154 in trench 126 and an opening 160 that exposes portions of dielectric layer 152 and the portions of polysilicon layer 154 in trenches 120 and 124. Masking structure 151 is also referred to as a mask or an etch mask.

Figure 9:
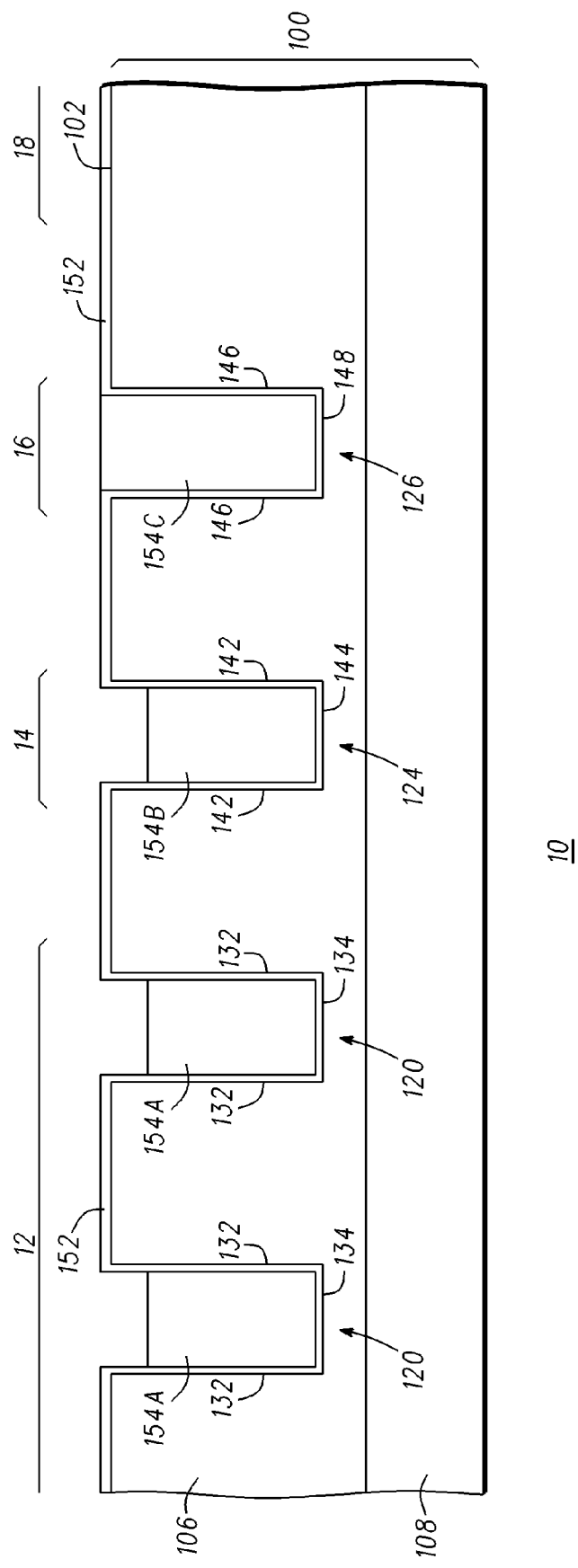
FIG. 9 is a cross-sectional view of the semiconductor component of FIG. 8 at a later stage of manufacture.

Referring now to FIG. 9, the portions of polysilicon layer 154 that are in trenches 120 and 124 are recessed so that they are below surface 102. The portions of polysilicon layer 154 are recessed using an isotropic etch technique that is fast and selective to dielectric layer 152, i.e., an isotropic etch that etches polysilicon and stops on dielectric material 152. By way of example, the isotropic etch recesses the portions of polysilicon layer 154 so that they are about 8,600 Å below surface 102. The isotropic etch leaves polysilicon portions 154A and 154B in trenches 120 and 124, respectively. For the sake of clarity, the portion of polysilicon layer 154 that is in trench 126 is identified by reference character 154C. Portions 154A, 154B, and 154C are referred to as shielding electrodes. Preferably, shielding electrodes 154A, 154B, and 154C will be connected to the source electrode in a subsequent step. Etch mask 151 is removed using techniques known to those skilled in the art.

Figure 10:
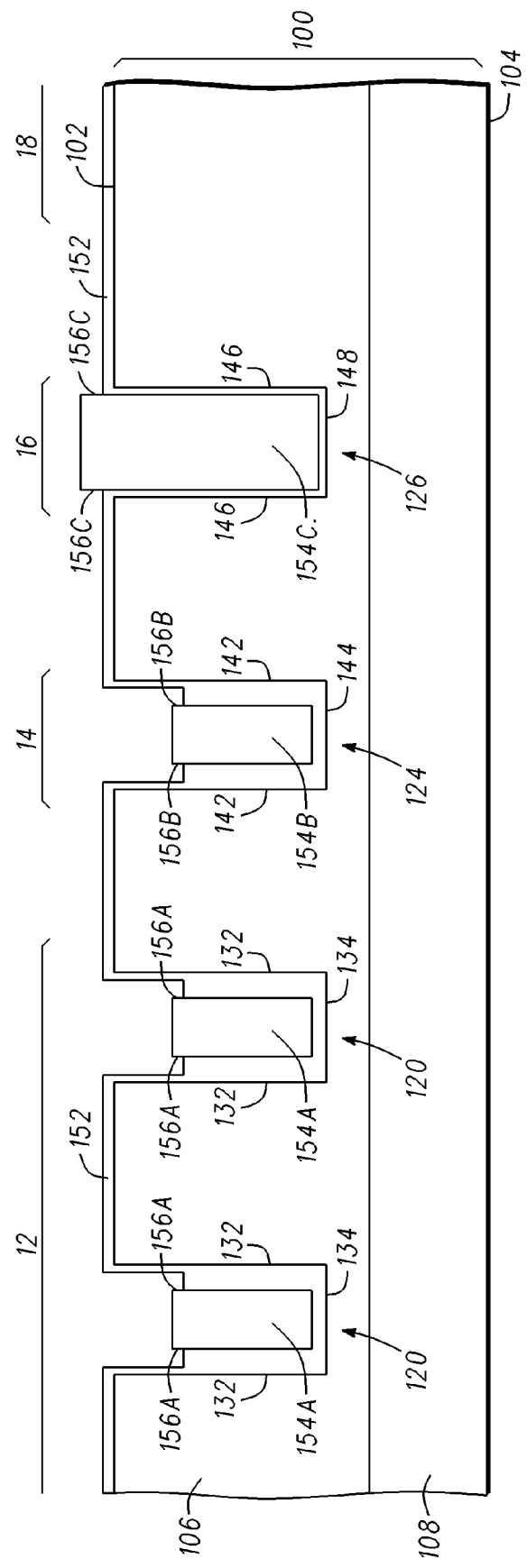
FIG. 10 is a cross-sectional view of the semiconductor component of FIG. 9 at a later stage of manufacture.

Referring now to FIG. 10, dielectric layer 152 is partially etched using an isotropic wet etch. A suitable etchant for etching dielectric layer 152 is a buffered hydrofluoric acid solution. By way of example, the etch removes dielectric layer 152 so that about 60% of its thickness remains after being etched. That is, if the thickness of dielectric layer 152 above surface 102 is about 1,150 Å, the thickness of dielectric layer 152 is about 700 Å after being etched by the buffered hydrofluoric acid. It should be noted that the thickness of dielectric layer 152 that is removed is not a limitation of the present invention. Partially etching dielectric layer 152 thins the portions of dielectric layer 152 along sidewalls 132 and 142 of trenches 120 and 124, and exposes portions 156A, 156B, and 156C of the sidewalls or sides of polysilicon portions 154A, 154B, and 154C, respectively. Thus, partially etching dielectric layer 152 forms protrusions that extend from the portions of dielectric layer 152 that are within trenches 120 and 124, where the protrusions are parts of polysilicon portions 154A and 154B. Similarly, partially stripping dielectric layer 152 forms a protrusion that extends from trench 126, wherein the protrusion is a part of polysilicon portion 154C.

Figure 11:
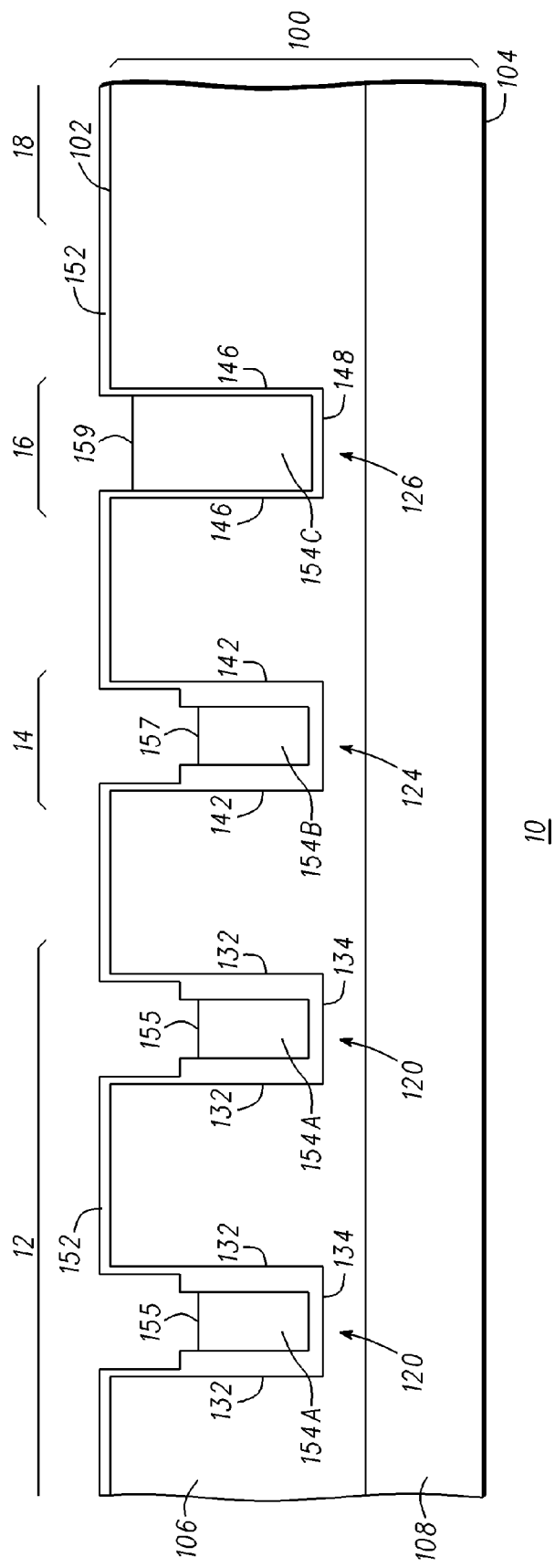
FIG. 11 is a cross-sectional view of the semiconductor component of FIG. 10 at a later stage of manufacture.

Referring now to FIG. 11, polysilicon portions 154A, 154B, and 154C are further recessed using an isotropic etch that selectively removes polysilicon. By way of example, polysilicon portions 154A, 154B, and 154C are recessed using a reactive ion etch. Recessing polysilicon portions 154A, 154B, and 154C removes exposed portions 156A, 156B, and 156C and exposes portions of dielectric layer 152 and surfaces 155, 157, and 159 that are within trenches 120, 124, and 126, respectively. By way of example, exposed surfaces 155 and 157 of polysilicon portions 154A and 154B are about 10,000 Å below surface 102 and exposed surface 159 of polysilicon portion 154C is about 1,400 Å below surface 102.

Figure 12:
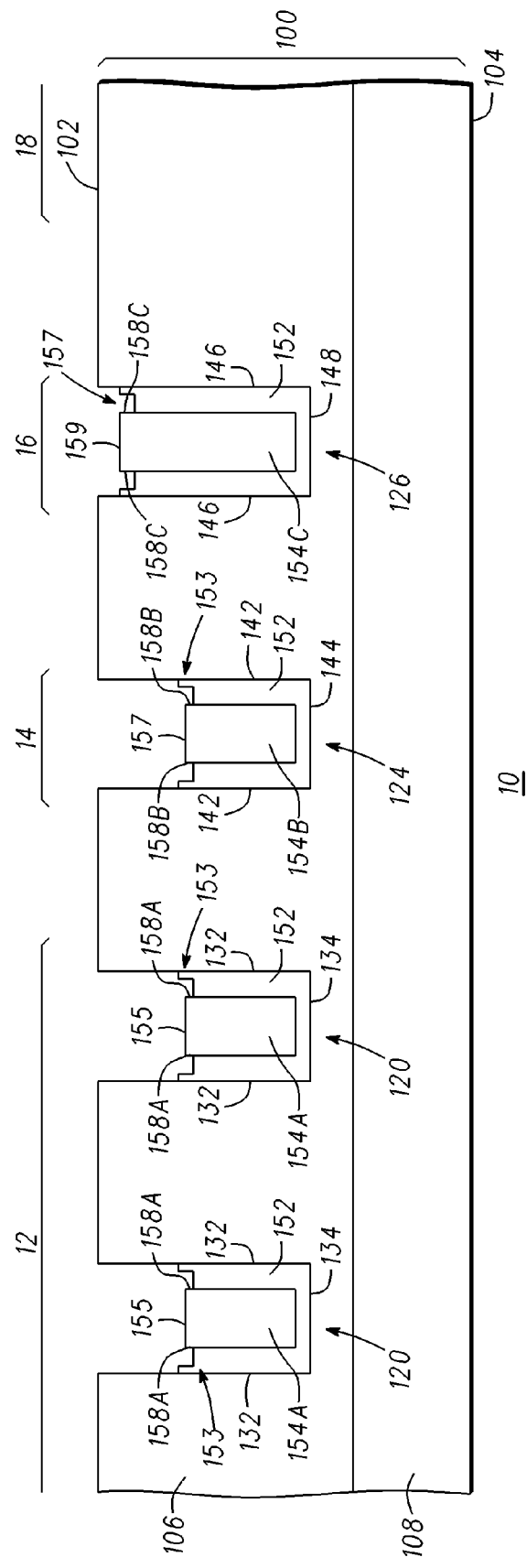
FIG. 12 is a cross-sectional view of the semiconductor component of FIG. 11 at a later stage of manufacture.

Referring now to FIG. 12, portions of dielectric layer 152 are stripped using an isotropic wet etch. A suitable etchant for stripping dielectric layer 152 is a buffered hydrofluoric acid solution. The etch removes dielectric layer 152 from surface 102 and from the upper portions of sidewalls 132, 142, and 146 within trenches 120, 124, and 126, respectively. Stripping dielectric layer 152 exposes portions 158A, 158B, and 158C of the sidewalls of polysilicon portions 154A, 154B, and 154C, respectively. In addition, stripping dielectric layer 152 forms dielectric or oxide stubs 153 along sidewalls 132 and 142 of trenches 120 and 124. Oxide stubs 153 are portions of dielectric layer 152 and are laterally spaced apart from portions 158A and 158B of polysilicon portions 154A and 154B. Similarly, partially stripping dielectric layer 152 forms oxide stubs 157 along sidewalls 146 of trench 126. Oxide stubs 157 are laterally spaced apart from portions 158C of polysilicon portion 154C.

Figure 13:
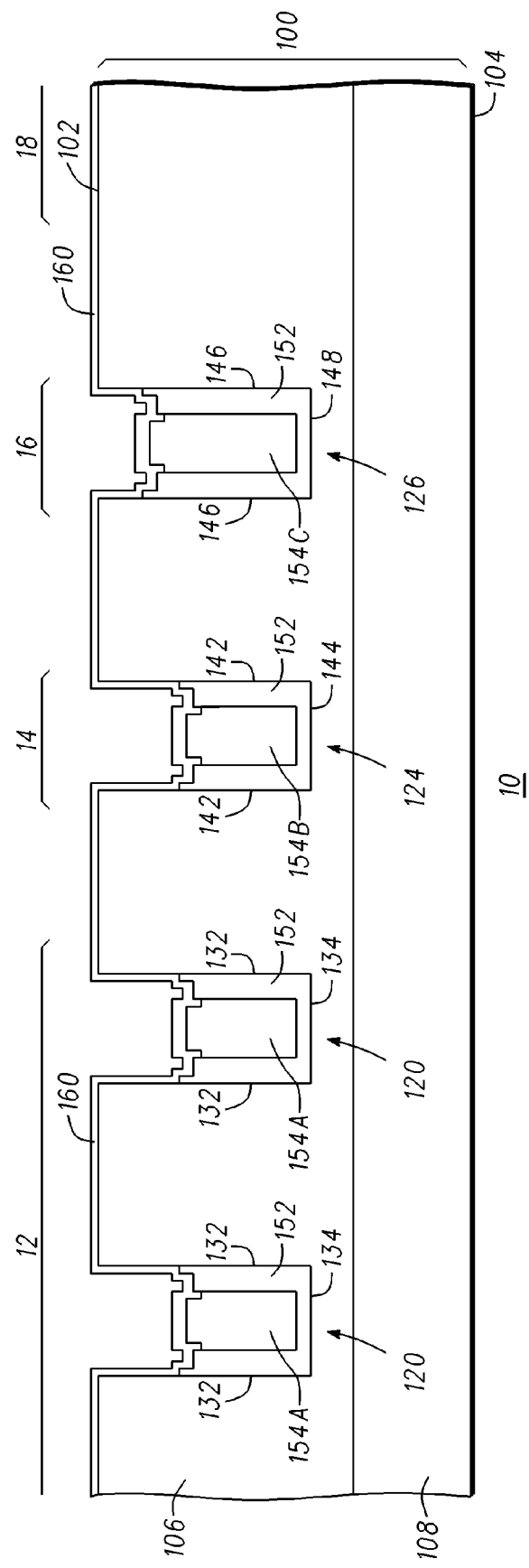
FIG. 13 is a cross-sectional view of the semiconductor component of FIG. 12 at a later stage of manufacture.

Referring now to FIG. 13, a layer of dielectric material 160 having a thickness ranging from about 250 Å to about 750 Å is formed from or on surface 102, from or on the exposed portions of sidewalls 132, 142, and 146, from or on polysilicon portions 154A, 154B, and 154C, and over the portions of dielectric layer 152 that are along sidewalls 132, 142, and 146. Preferably, dielectric layer 160 is slowly formed using a high temperature oxidation process in a dry ambient so that the phosphorus in polysilicon portions 154A, 154B, and 154C can back diffuse. By way of example, dielectric layer 160 has a thickness of about 450 Å.

Figure 14:
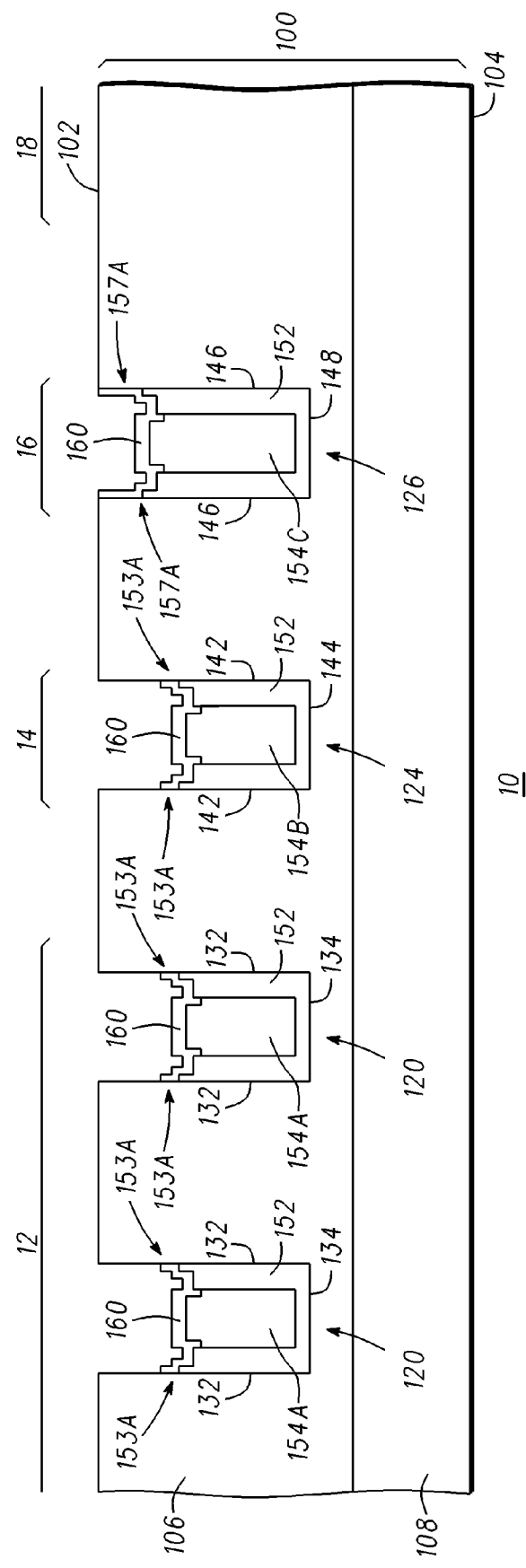
FIG. 14 is a cross-sectional view of the semiconductor component of FIG. 13 at a later stage of manufacture.

Referring now to FIG. 14, dielectric layer 160 is removed from surface 102 and from the upper portions of sidewalls 132, 142, and 146 of trenches 120, 124, and 126, respectively. Preferably, the amount of dielectric material that is removed is selected to leave portions of dielectric material 160 over polysilicon portions 154A, 154B, and 154C. In addition, removing dielectric layer 160 from surface 102 and from portions of sidewalls 132 and 142 forms dielectric or oxide stubs 153A by enlarging dielectric stubs 153. Oxide stubs 153A are portions of dielectric layer 160 and extend vertically from oxide stubs 153. Similarly, removing dielectric layer 160 from surface 102 and from portions of sidewalls 146 forms dielectric or oxide stubs 157A along sidewalls 146 of trench 126 by enlarging oxide stubs 157. Oxide stubs 157A are portions of dielectric layer 160 and extend vertically from oxide stubs 157. For the sake of clarity, oxide stubs 153 and 153A are referred to as oxide stubs 153A, oxide stubs 157 and 157A are referred to as oxide stubs 157A.

Figure 15:
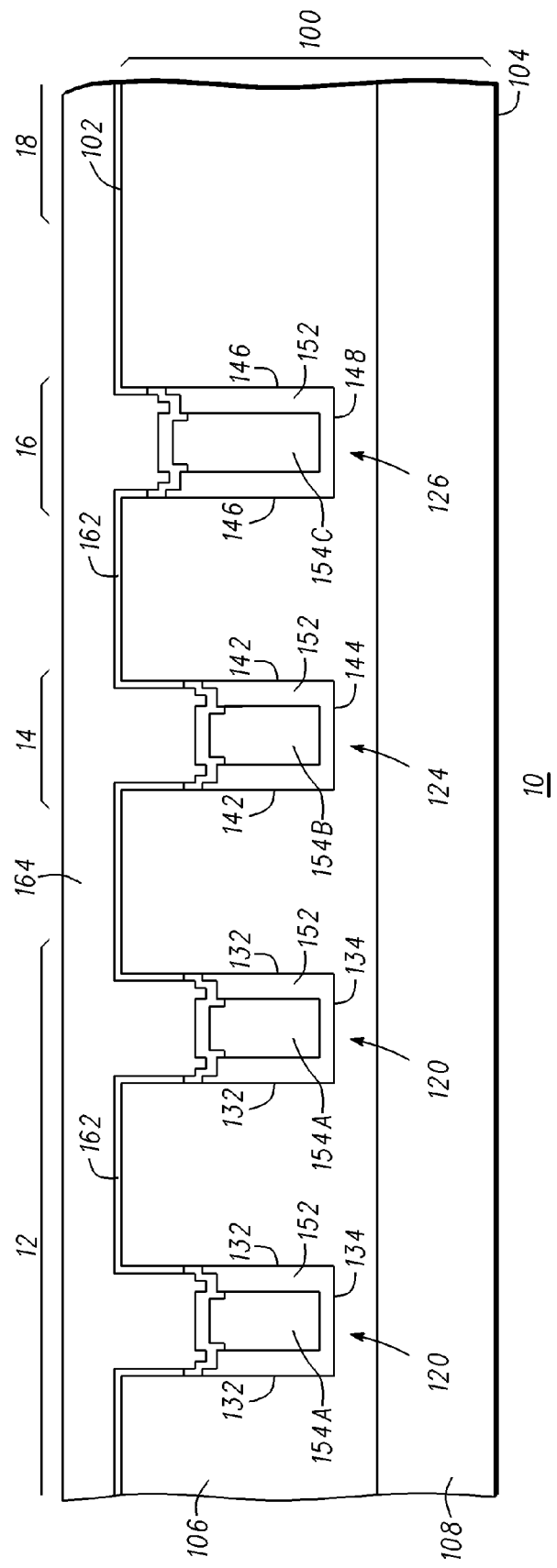
FIG. 15 is a cross-sectional view of the semiconductor component of FIG. 14 at a later stage of manufacture.

Referring now to FIG. 15, a layer of dielectric material 162 such as, for example, oxide, having a thickness ranging from about 250 Å to about 750 Å is formed from or on surface 102, from or on the exposed portions of sidewalls 132, 142, and 146, and from or on the remaining portions of dielectric layer 160. By way of example, dielectric layer 162 has a thickness of about 450 Å. The portions of dielectric material 162 along sidewalls 132, 142, and 146 serve as a gate dielectric material. It should be noted that in the regions of oxide stubs 153A and 157A, gate oxide 162 is grown through oxide stubs 153A and 157A, respectively.

A layer of polysilicon 164 having a thickness ranging from about 3,500 Å to about 6,000 Å is formed on dielectric layer 162 and preferably fills trenches 120, 124, and 126. When the conductivity type of epitaxial layer 106 is N-type, the conductivity type of polysilicon layer 154 is preferably N-type. Polysilicon layer 164 is annealed so that it is substantially free of voids. By way of example, polysilicon layer 164 is doped with phosphorus, has a thickness of about 4,800 Å, and is annealed at a temperature of about 900° C. for about 60 minutes. Polysilicon layer 164 is treated with a buffered hydrofluoric acid dip to remove any oxide that may have formed on its surface.

Figure 16:
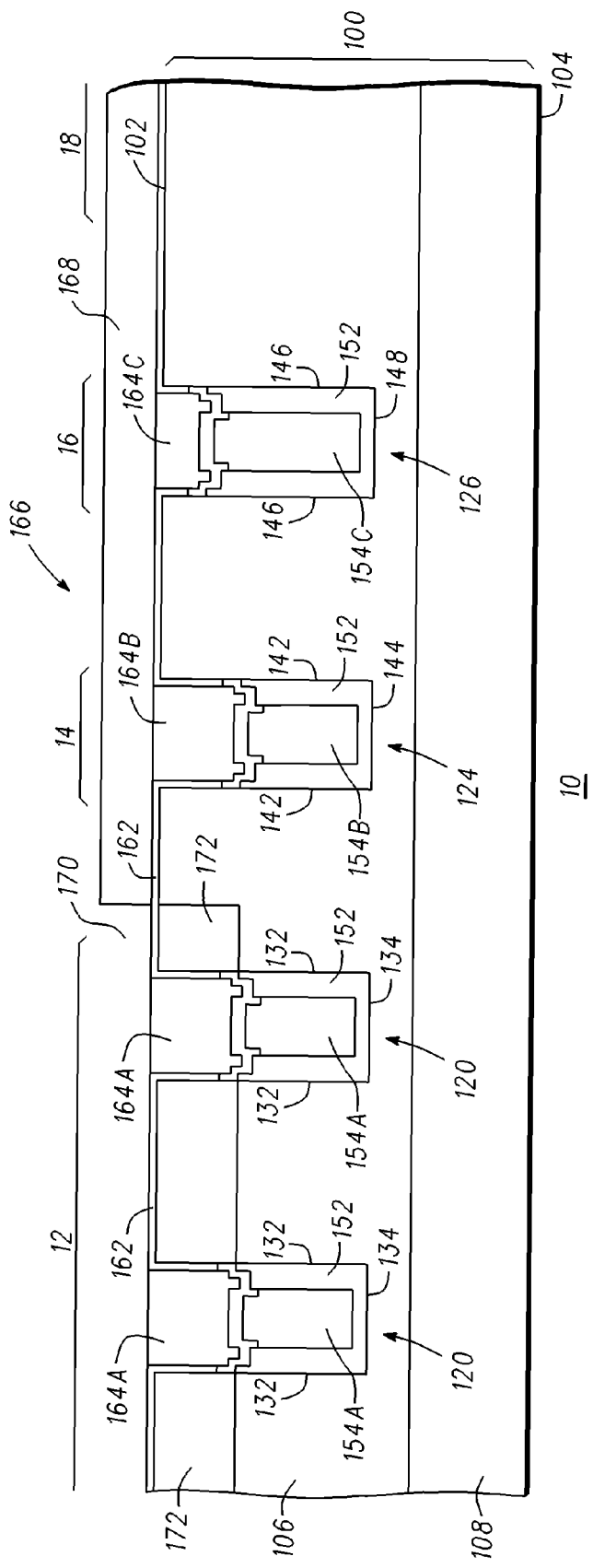
FIG. 16 is a cross-sectional view of the semiconductor component of FIG. 15 at a later stage of manufacture.

Referring now to FIG. 16, polysilicon layer 164 is planarized using, for example, a CMP process that is selective for the material of dielectric layer 162, i.e., dielectric layer 162 serves as an etch stop for the CMP process. Planarization of polysilicon layer 164 leaves portions 164A, 164B, and 164C of polysilicon layer 164 in trenches 120, 124, and 126, respectively. A layer of photoresist is patterned over the portions of polysilicon layer 164 in trenches 120, 124, and 126 and over the exposed portions of dielectric layer 162 to form a masking structure 166 having a masking element 168 that protects the portion of polysilicon layer 164 in trench 126 and an opening 170 that exposes portions of dielectric layer 162 and the portions of polysilicon layer 164 in trenches 120 and 124. Masking structure 166 is also referred to as a mask or an implant mask.

An impurity material of, for example, P-type conductivity is implanted into the portions of epitaxial layer 106 that are laterally adjacent to trenches 120, i.e., the portions of epitaxial layer 106 that are unprotected by masking element 168. The implant forms doped regions 172 which serve as a P-type high voltage implant. The impurity material is also implanted into portions 164A, 164B, and 164C of polysilicon layer 164. Suitable dopants for the P-type implant include boron, indium, or the like. Masking structure 166 is removed and epitaxial layer 106 is annealed. Optionally, a source implant can be performed using masking structure 166. For example, an impurity material of N-type conductivity may be implanted into doped regions 172.

Figure 17:
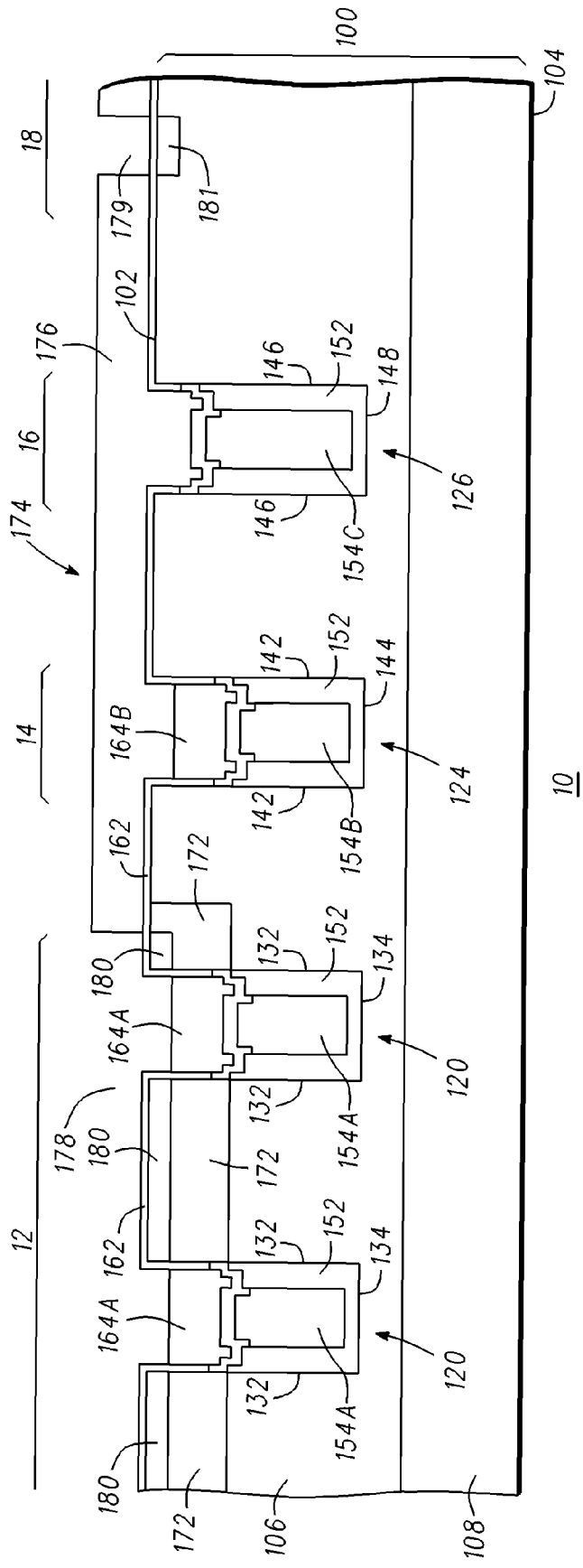
FIG. 17 is a cross-sectional view of the semiconductor component of FIG. 16 at a later stage of manufacture.

Referring now to FIG. 17, masking structure 166 is removed using techniques known to those skilled in the art. Polysilicon portions 164A, 164B, and 164C, i.e., the remaining portions of polysilicon layer 164 that are in trenches 120, 124, and 126, are recessed so that they are below surface 102. Preferably, polysilicon portion 164C is substantially completely removed from trench 126. By way of example, polysilicon portions 164A, 164B, and 164C are recessed using an isotropic etch technique that is fast and selective to dielectric layer 162, i.e., an isotropic etch that etches polysilicon and stops on dielectric material 162. By way of example, the isotropic etch recesses polysilicon portions 164A and 164B so that they are about 750 Å below surface 102. Portions 164A and 164B are referred to as gate electrodes and are connected together in the layout.

Still referring to FIG. 17, a layer of photoresist is patterned over polysilicon portions 164A and 164B and dielectric layer 162 to form a masking structure 174 having a masking element 176 that protects polysilicon portion 164B, trench 126, and termination region 16, and an opening 178 that exposes active or device region 12, i.e., polysilicon portions 164A and 164B and the portions of epitaxial layer 106 that contain doped regions 172 and an opening 179 that exposes a portion of drain contact region 18. Masking structure 174 is also referred to as a mask or an implant mask. An impurity material of N-type conductivity is implanted into the portions of epitaxial layer 106 that are laterally adjacent to trenches 120, i.e., the portions of epitaxial layer 106 that contain doped region 172 and that are unprotected by masking element 176. The implant forms doped regions 180 which serve as a source regions for semiconductor component 10 and a doped region 181 that serves as a contact implant to preclude inversion of surface charge. Masking structure 174 is removed and epitaxial layer 106 is annealed.

Figure 18:
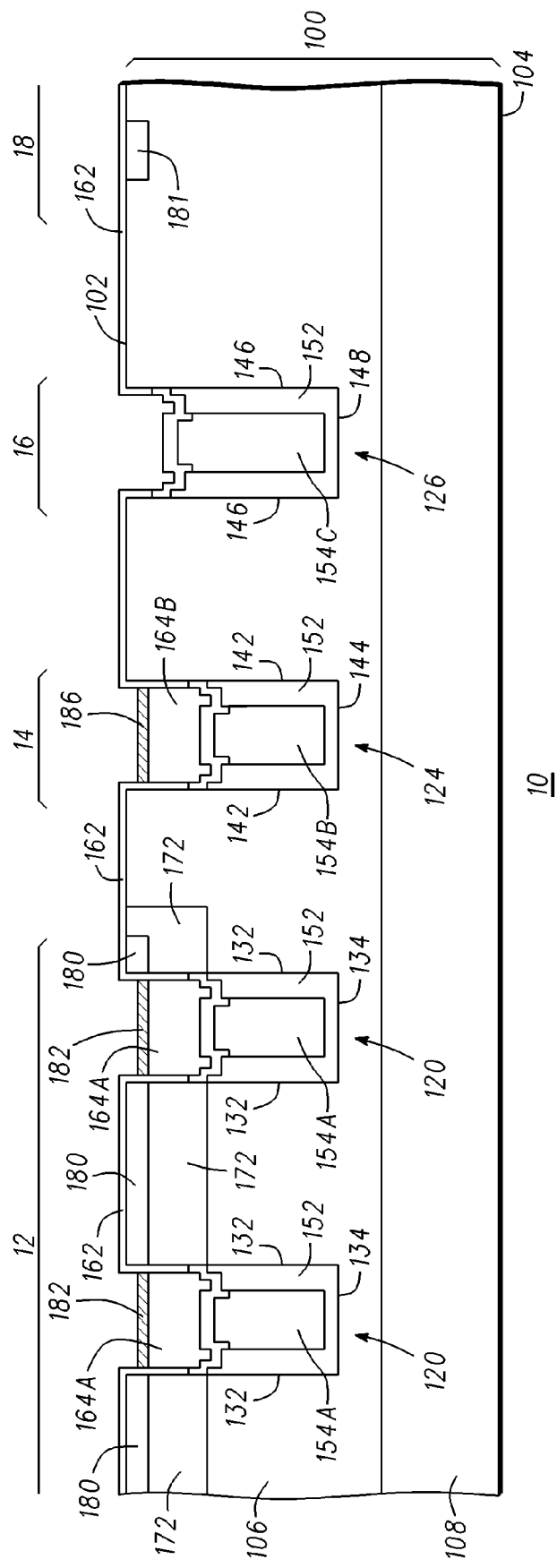
FIG. 18 is a cross-sectional view of the semiconductor component of FIG. 17 at a later stage of manufacture.

Referring now to FIG. 18, polysilicon portions 164A and 164B and the exposed portions of dielectric layer 162 are cleaned using a dilute or buffered hydrofluoric acid solution. In accordance with one example, the clean removes about 35 Å from dielectric layer 162 and removes substantially all oxide formed on the top surfaces of polysilicon portions 164A and 164B. A layer of refractory metal (not shown) is conformally deposited over gate electrodes 164A, gate contact electrode 164B, and on dielectric layer 162. Preferably, the refractory metal is cobalt having a thickness ranging from about 100 Å to about 1,000 Å. The cobalt that is in contact with polysilicon or silicon is converted to cobalt silicide using a rapid thermal anneal technique. For example, the refractory metal is heated to a temperature ranging from about 350° C. to about 850° C. The heat treatment causes the cobalt to react with the silicon to form cobalt silicide in all regions in which the cobalt contacts polysilicon or silicon. As those skilled in the art are aware, silicide layers that are self aligned are referred to as salicide layers. Thus, cobalt salicide layers 182 are formed from gate electrodes 164A and cobalt salicide layer 186 is formed from gate contact electrode 164B. The portions of the cobalt over dielectric layer 162 remain unreacted. After the formation of the cobalt silicide layers, any unreacted cobalt is removed using, for example, a selective wet etch. After removal of the unreacted cobalt, the cobalt silicide is annealed again using, for example, a rapid thermal anneal process. It should be understood that the type of silicide is not a limitation of the present invention. For example, other suitable salicides include nickel salicide, platinum salicide, titanium salicide, or the like.

Figure 19:
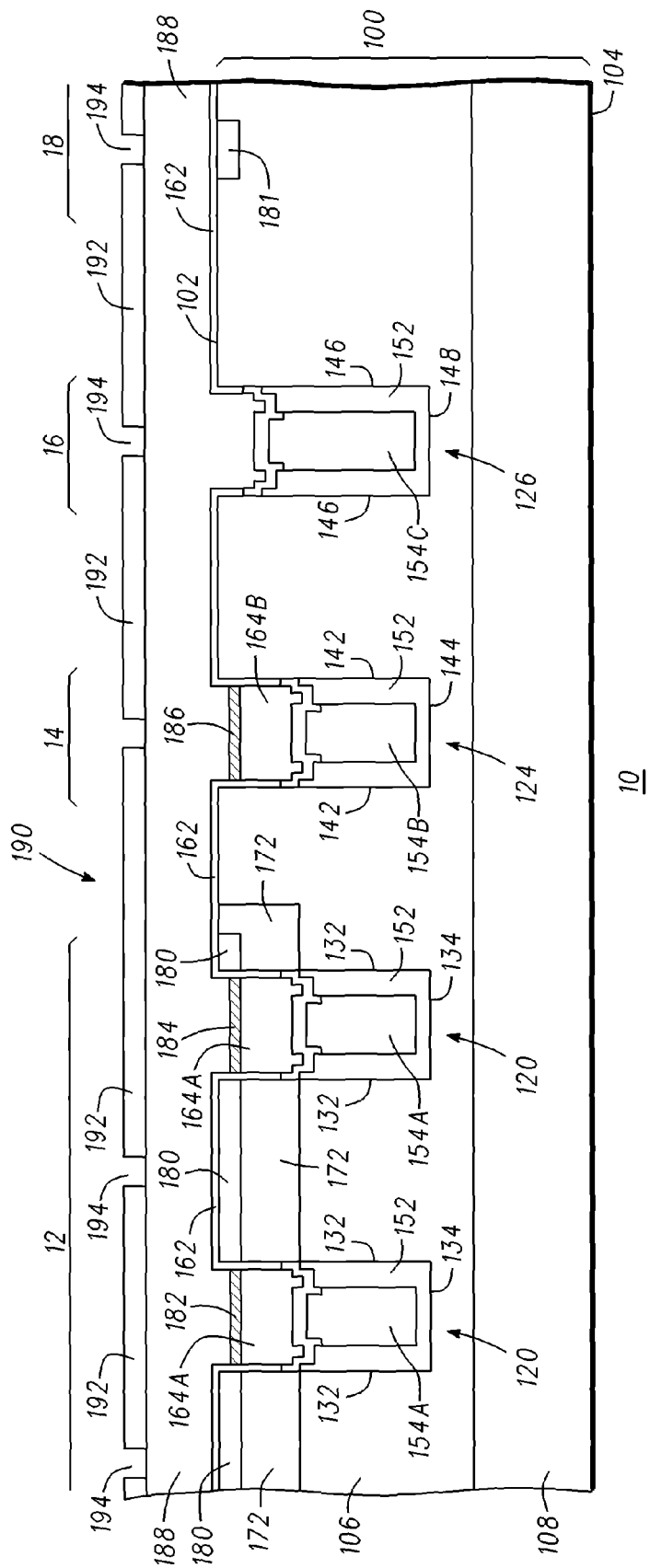
FIG. 19 is a cross-sectional view of the semiconductor component of FIG. 18 at a later stage of manufacture.

Referring now to FIG. 19, a layer of dielectric material 188 having a thickness ranging from about 3,000 Å to about 12,000 Å is formed on salicide layers 182 and 186 and on dielectric layer 162. Dielectric layer 188 may be comprised of a single layer of dielectric material or a dielectric material comprised of a plurality of sub-layers. In accordance with an embodiment of the present invention, dielectric layer 188 is a multi-dielectric material comprising a low phosphorus doped layer formed by atmospheric pressure chemical vapor deposition ("APCVD") and a silane based oxide layer formed by plasma enhanced chemical vapor deposition ("PECVD"). Preferably the low phosphorus doped layer is formed on salicide layers 182 and 186 and dielectric layer 162 and has a thickness of about 4,500 Å and the silane based oxide layer is formed on the low phosphorus doped layer and has a thickness of about 4,800 Å. Dielectric layer 188 is planarized using, for example, a CMP process. After planarization, dielectric layer 188 preferably has a thickness of about 7,000 Å. Alternately, dielectric layer 188 may be a layer of borophosphosilicate glass ("BPSG") which can be reflowed by heating.

Still referring to FIG. 19, a layer of photoresist is patterned over dielectric layer 188 to form a masking structure 190 having masking elements 192 and openings 194 that expose portions of dielectric layer 188. Masking structure 190 is also referred to as a mask or an etch mask.

Figure 20:
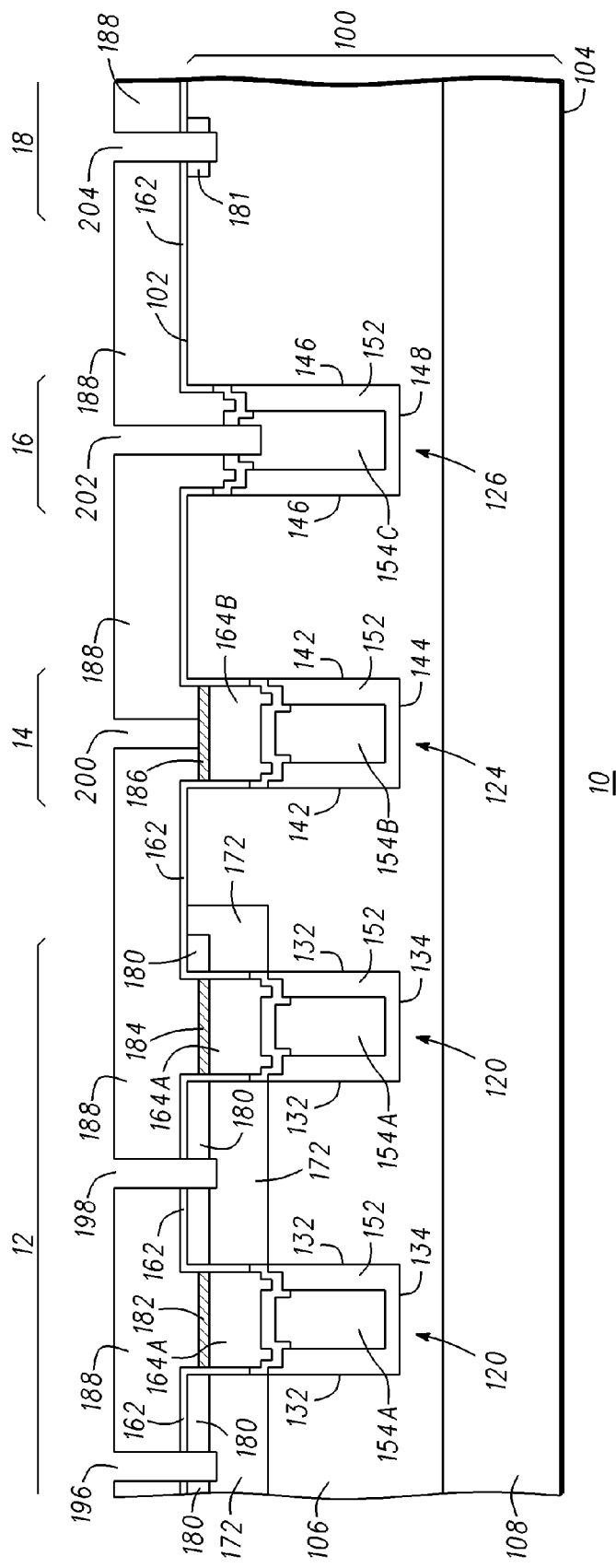
FIG. 20 is a cross-sectional view of the semiconductor component of FIG. 19 at a later stage of manufacture.

Referring now to FIG. 20, the exposed portions of dielectric layer 188 are anisotropically etched using, for example, a reactive ion etch to form openings 196, 198, 200, 202, and 204 in dielectric layer 188, where opening 196 exposes a portion of doped region 180 that is adjacent to trench 124, opening 198 exposes the portion of doped region 180 that is between trenches 120, opening 200 exposes salicide layer 186, opening 202 exposes polysilicon portion 154C, and opening 204 exposes a portion of epitaxial layer 106. Preferably, the anisotropic etch that forms openings 196, 198, 200, 202, and 204 is selective to salicide layer 186 and to silicon, i.e., the etch stops on salicide layer 186, the exposed portions of epitaxial layer 106 that contains doped regions 180, the exposed portion of epitaxial layer 106, and polysilicon portion 154C. Masking structure 190 is removed.

The exposed portions of epitaxial layer 106 that contain doped regions 180, the exposed portion of epitaxial layer 106, and polysilicon portion 154C are recessed using, for example, a reactive ion etch, that is, openings 196, 198, 202, and 204 are extended into the respective epitaxial layer 106 and polysilicon portion 154C and serve as contact openings. The etch forming the recesses may remove about 900 Å from dielectric material 188. The exposed portion of salicide layer 186, the exposed portions of epitaxial layer 106 that contain doped regions 180, the exposed portion of epitaxial layer 106, and the polysilicon portion 154C are cleaned using a dilute or buffered hydrofluoric acid solution. Preferably, the clean removes substantially all oxide formed on the exposed portion of salicide layer 186, the exposed portions of epitaxial layer 106 that contain doped regions 180, the exposed portion of epitaxial layer 106, and the polysilicon portion 154C.

Figure 21:
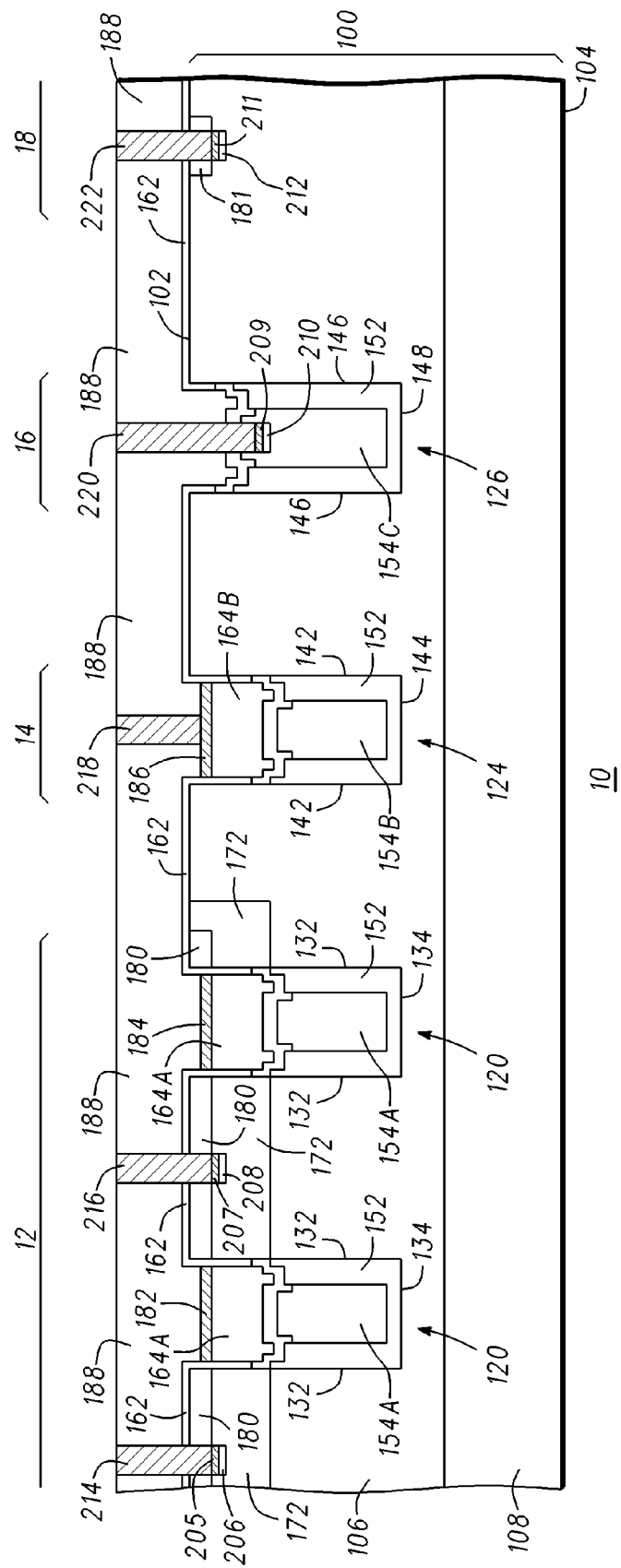
FIG. 21 is a cross-sectional view of the semiconductor component of FIG. 20 at a later stage of manufacture.

Referring now to FIG. 21, an impurity material of P-type conductivity is implanted into the exposed portions of epitaxial layer 106 that contain doped regions 180, the exposed portion of epitaxial layer 106, and polysilicon portion 154D. The implant forms doped regions 206 in the portion of doped region 180 that is adjacent to trench 122, i.e., the portion exposed by opening 196, doped region 208 in the portion of doped region 180 that is between trenches 120, i.e., the portion exposed by opening 198, doped region 210 in polysilicon portion 154C, i.e., the portion exposed by opening 202, and doped region 212 in the portion of epitaxial layer 106 exposed by opening 204. Epitaxial layer 106 and polysilicon portion 154C are cleaned using, for example, a buffered hydrofluoric acid solution and then annealed. It should be understood that annealing epitaxial layer 106 and polysilicon portion 154C also anneals polysilicon portions 154A and 154B.

Silicide layers 205, 207, 209, and 211 are formed in the portions of epitaxial layer 106 exposed by openings 196, 198, 202, and 204, respectively. By way of example, silicide layers 205, 207, 209, and 211 are titanium silicide layers. Like silicide layers 182 and 186, the type of silicide formed in openings 196, 198, 202, and 204 is not a limitation of the present invention. For example, other suitable silicides include nickel silicide, platinum silicide, cobalt silicide, or the like. Techniques for forming silicide layers 205, 207, 209, and 211 are known to those skilled in the art.

A barrier layer is formed in contact with silicide layers 186, 205, 207, 209, and 211. The barrier layer is planarized using, for example, CMP, to form conductive plugs 214, 216, 218, 220, and 222 in openings 196, 198, 200, 202, and 204, respectively. Suitable materials for the barrier layer include titanium nitride, titanium tungsten, or the like.

Figure 22:
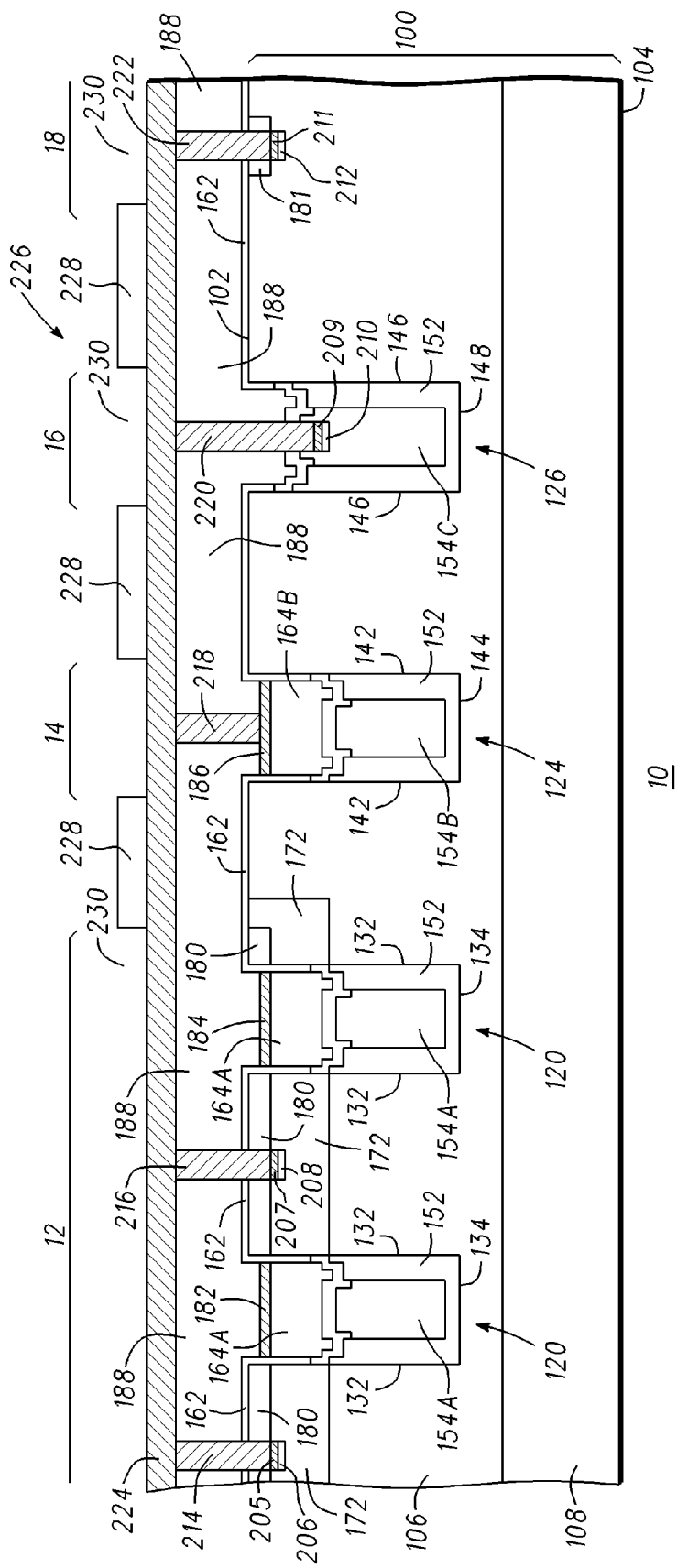
FIG. 22 is a cross-sectional view of the semiconductor component of FIG. 21 at a later stage of manufacture.

Referring now to FIG. 22, a metallization system 224 such as, for example, an aluminum-copper (AlCu) metallization system, is formed in contact with conductive plugs 214, 216, 218, 220, and 222. A layer of photoresist is patterned over metallization system 224 to form a masking structure 226 having masking elements 228 and openings 230 that expose portions of metallization system 224. Masking structure 226 is also referred to as a mask or an etch mask.

Referring again to FIG. 1, the exposed portions of metallization system 224 (shown in FIG. 22) are etched to form a source conductor 232 in contact with plugs 214 and 216, a gate conductor 234 in contact with plug 218, and a shielding contact conductor 236 in contact with plug 220, and a top side drain conductor 238 in contact with plug 222. A passivation layer 240 is formed over electrodes 232, 234, 236, 238, and dielectric material 240.

Figure 23:
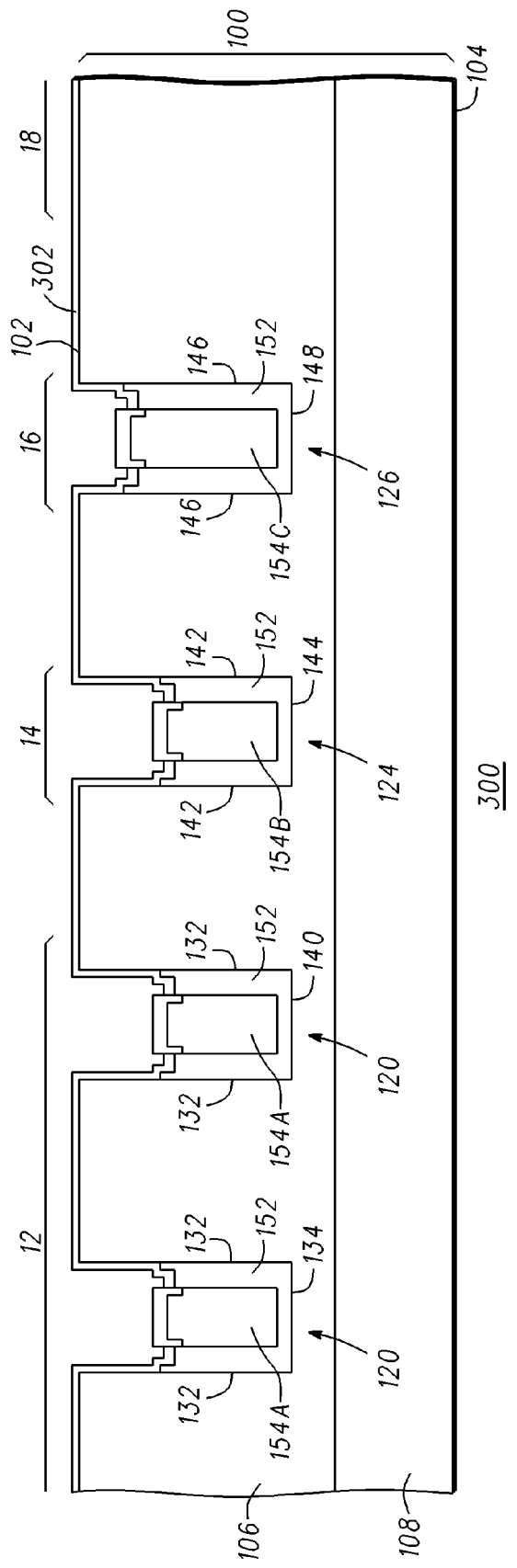
FIG. 23 is a cross-sectional view of a semiconductor component during manufacture in accordance with another embodiment of the present invention.

FIG. 23 is a cross-sectional side view of a portion of a semiconductor component 300 during manufacture in accordance with another embodiment of the present invention. It should be noted that the description of FIG. 23 continues from the description of FIG. 12. A layer of dielectric material 302 having a thickness ranging from about 250 Å to about 750 Å is formed from or on surface 102, and from or on the exposed portions of sidewalls 132, 142, and 146. Preferably, dielectric layer 302 is slowly formed using a high temperature oxidation process in a dry ambient. By way of example, dielectric layer 302 has a thickness of about 450 Å. The portions of dielectric material 302 along sidewalls 132, 142, and 146 serve as a gate dielectric material.

Figure 24:
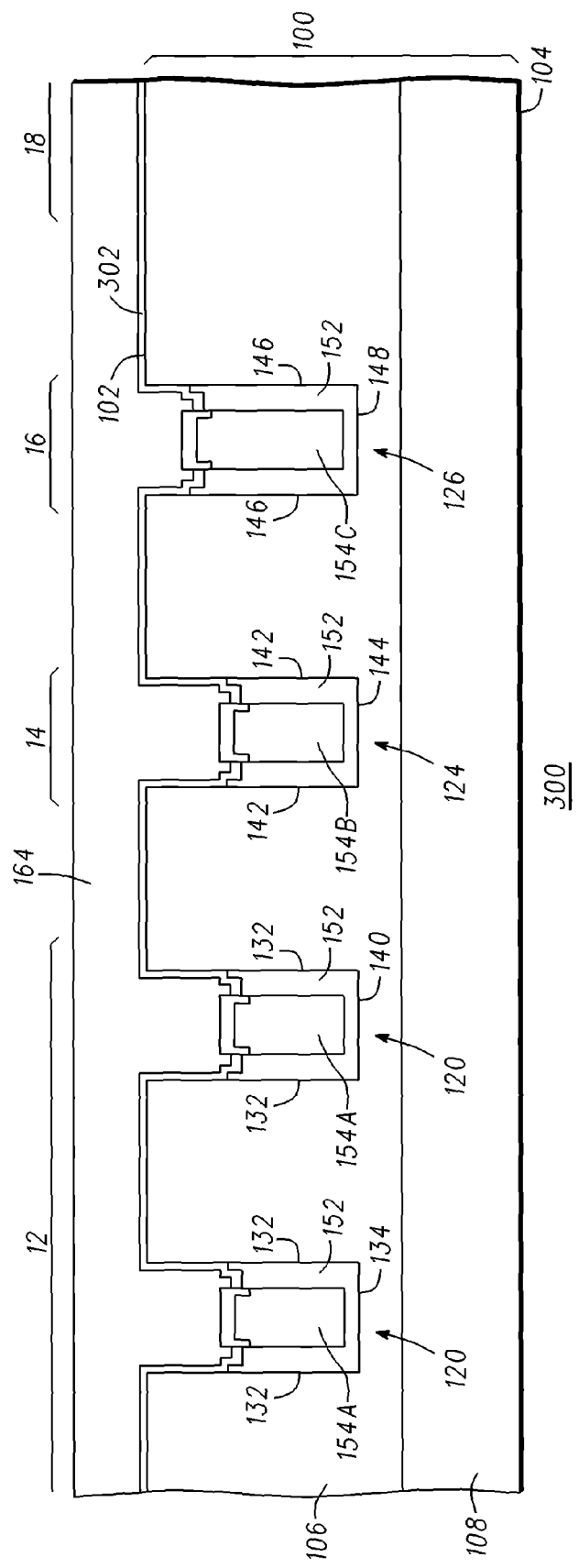
FIG. 24 is a cross-sectional view of the semiconductor component of FIG. 23 at a later stage of manufacture.

Referring now to FIG. 24, a layer of polysilicon 164 having a thickness ranging from about 3,500 Å to about 6,000 Å is formed on dielectric layer 302 and preferably fills trenches 120, 124, and 126. When the conductivity type of epitaxial layer 106 is N-type, the conductivity type of polysilicon layer 154 is preferably N-type. Polysilicon layer 164 is annealed so that it is substantially free of voids. By way of example, polysilicon layer 164 is doped with phosphorus, has a thickness of about 4,800 Å, and is annealed at a temperature of about 1,100° C. for about 20 minutes. Polysilicon layer 164 is treated with a buffered hydrofluoric acid dip to remove any oxide that may have formed on the surface.

Figure 25:
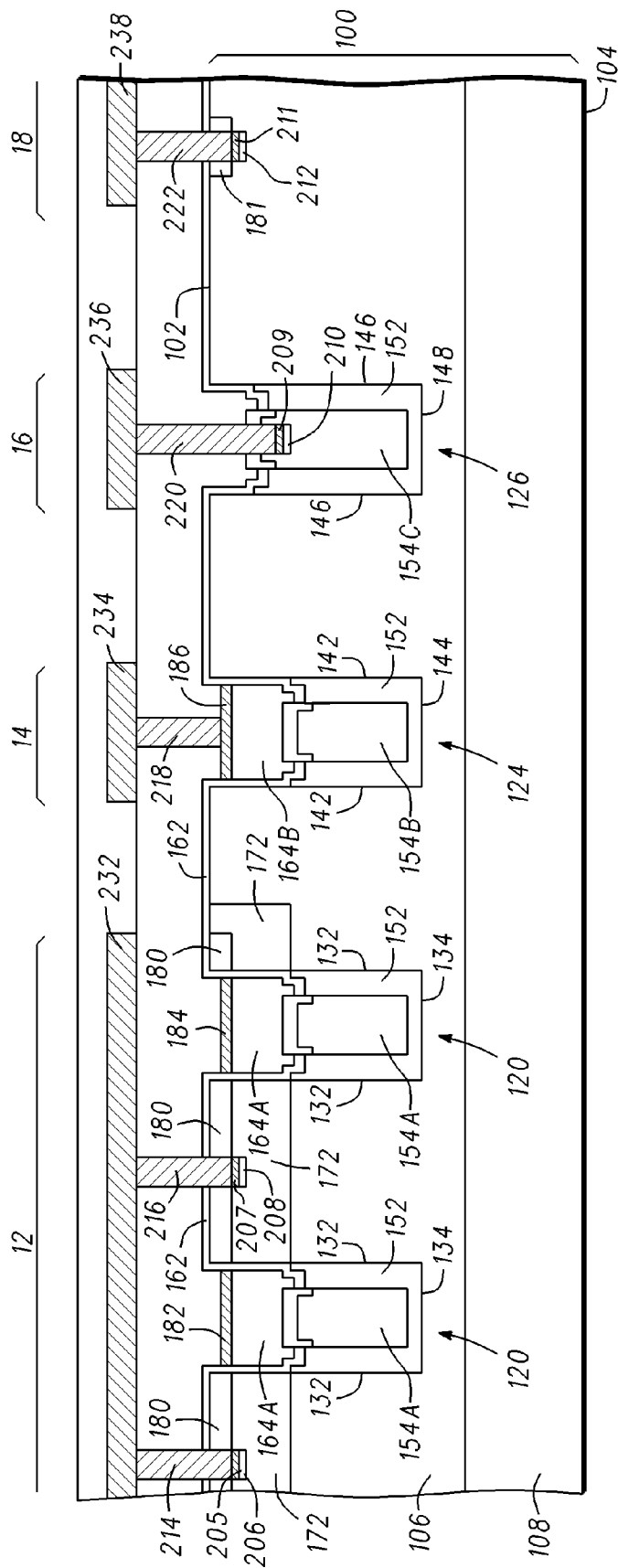
FIG. 25 is a cross-sectional view of the semiconductor component of FIG. 24 at a later stage of manufacture.

It should be noted that the description of the manufacture of semiconductor component 300 continues at FIG. 16 with the description of semiconductor component 10. FIG. 25 is a cross-sectional view of semiconductor component 300 at a later stage of manufacture. By way of example, semiconductor component 300 is an N-channel field effect transistor that has an active region 12, a gate contact region 14, a termination region 16, and a drain contact region 18. Active region 12 includes source regions 180, gate electrodes 164A, drain regions, and doped regions 172. The portions of epitaxial layer 106 adjacent to doped region 172 serve as the drain regions and the channel regions are formed from doped regions 172 and 180 and gate electrodes 164A Gate contact region 14 facilitates electrically coupling the gate regions that are in active region 12 to an input/output conductor (not shown). A termination region 16 facilitates electrically coupling shield conductors 154A that are in active region 12, shield conductor 154B that is in gate contact region 14, and shield conductor 154D to a common termination conductor 236. Drain contact region 18 facilitates contacting the drain regions that are in active region 12 to a drain conductor 238.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A method for manufacturing a semiconductor component, comprising:
    providing a semiconductor material having first and second major surfaces;
    forming a plurality of trenches in the semiconductor material;
    forming a first layer of dielectric material over the plurality of trenches;
    forming a first electrode in a first portion of a first trench of the plurality of trenches, the first electrode having opposing sides and the first trench having at least one sidewall;
    thinning the first layer of dielectric material;
    recessing the first electrode in the first portion of the first trench of the plurality of trenches after thinning the first layer of dielectric material;
    further thinning the first layer of dielectric material to expose portions of the opposing sides of the first electrode after recessing the first electrode;
    forming a second layer of dielectric material over at least the first trench of the plurality of trenches; and
    forming a second electrode in a second portion of the first trench.

2. The method of claim 1, wherein thinning the first layer of dielectric material exposes the portions of the opposing sides of the first electrode in the first portion of the first trench of the plurality of trenches.

3. The method of claim 1, further including forming a first doped region adjacent the first major surface and the first trench of the plurality of trenches.

4. The method of claim 3, further including forming a second doped region within the first doped region.

5. The method of claim 1, further including:
forming a third electrode in a first portion of a second trench of the plurality of trenches, wherein the third electrode has opposing sides, the second trench has at least one sidewall, and wherein forming the first layer of dielectric material includes forming the first layer of dielectric material in the second trench;
thinning the first layer of dielectric material in the second trench;
recessing the third electrode in the first portion of the second trench;
further thinning the first layer of dielectric material in the second trench to expose portions of opposing sides of the third electrode;
forming a portion of the second layer of dielectric material over the second trench; and
forming a fourth electrode in a second portion of the second trench.

6. The method of claim 1, further including:
forming a third electrode in a third trench of the plurality of trenches; and
recessing the third electrode.

7. The method of claim 1, further including forming an electrical contact to the semiconductor material.

8. The method of claim 7, wherein forming the electrical contact includes forming a top side electrical contact.

9. The method of claim 1, further including forming a silicide from the second electrode.

10. The method of claim 9, wherein the silicide is cobalt silicide.

11. A method for manufacturing a semiconductor component, comprising:
providing a semiconductor material having first and second major surfaces;
forming a plurality of trenches in the semiconductor material;
forming a first layer of dielectric material over the plurality of trenches;
forming a first electrode in a first portion of a first trench of the plurality of trenches, the first electrode having opposing sides and the first trench having at least one sidewall;
thinning the first layer of dielectric material;
recessing the first electrode in the first portion of the first trench of the plurality of trenches;
further thinning the first layer of dielectric material to expose portions of the opposing sides of the first electrode;
forming a second layer of dielectric material over at least the first trench of the plurality of trenches;
removing the second layer of dielectric'material from a portion of the at least one sidewall of the first trench, wherein further thinning the first layer of dielectric material and removing the second layer of dielectric material from the portion of the at least one sidewall forms a dielectric stub;
forming a third layer of dielectric material on the at least one sidewall of the first trench; and
forming the first electrode on the third layer of dielectric material; and
forming a second electrode in a second portion of the first trench.

12. The method of claim 1, wherein further thinning the first layer of dielectric material creates a dielectric stub laterally adjacent the first electrode.

13. The method of claim 1, wherein the dielectric stub is an oxide stub.

14. The method of claim 11, further including:
forming a third electrode in a first portion of a second trench of the plurality of trenches, wherein the third electrode has opposing sides, the second trench has at least one sidewall, and wherein forming the first layer of dielectric material includes forming the first layer of dielectric material in the second trench;
thinning the first layer of dielectric material in the second trench;
recessing the third electrode in the first portion of the second trench;
further thinning the first layer of dielectric material in the second trench to expose portions of opposing sides of the third electrode;
forming a portion of the second layer of dielectric material over the second trench; and
forming a fourth electrode in a second portion of the second trench.

15. The method of claim 11, wherein further thinning the first layer of dielectric material creates a dielectric stub laterally adjacent the first electrode.

* * * * *